United States Patent
Matsumoto et al.

(10) Patent No.: US 6,290,807 B1
(45) Date of Patent: Sep. 18, 2001

(54) APPARATUS AND METHOD FOR MICROWAVE PLASMA PROCESS

(75) Inventors: Naoki Matsumoto; Toshio Nakanishi, both of Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/225,457

(22) Filed: Jan. 6, 1999

(30) Foreign Application Priority Data

| Apr. 10, 1998 | (JP) | 10-099711 |
| Jul. 27, 1998 | (JP) | 10-210996 |
| Jul. 28, 1998 | (JP) | 10-212743 |

(51) Int. Cl.[7] ............................................. H05H 1/00
(52) U.S. Cl. ................ 156/345; 118/723 MW; 204/298.38
(58) Field of Search ................ 156/345; 118/723 MW, 118/723 AN; 204/298.38; 315/111.21

(56) References Cited

U.S. PATENT DOCUMENTS

| 4,282,267 | 8/1981 | Küyel . |
| 5,134,965 | 8/1992 | Tokuda et al. . |
| 5,487,875 | 1/1996 | Suzuki . |
| 5,517,085 | * 5/1996 | Engemann et al. .......... 118/723 MW |
| 5,538,699 | 7/1996 | Suzuki . |
| 5,685,942 | 11/1997 | Ishii . |
| 5,698,036 | 12/1997 | Ishii et al. . |
| 5,983,829 | * 11/1999 | Suzuki ...................... 118/723 MW |
| 6,076,484 | * 6/2000 | Matsumoto et al. ......... 118/723 MW |

FOREIGN PATENT DOCUMENTS

| 0 564 359 A1 | 10/1993 | (EP) . |
| 0 791 949 A2 | 8/1997 | (EP) . |
| 0 880 164 A1 | 11/1998 | (EP) . |
| 62-5600 | 1/1987 | (JP) . |
| 62-99481 | 5/1987 | (JP) . |
| 5-43097 | 10/1993 | (JP) . |
| 5-345982 | 12/1993 | (JP) . |
| 7-90591 | 4/1995 | (JP) . |
| 8-227800 | 9/1996 | (JP) . |
| 10-233295 | 9/1998 | (JP) . |

* cited by examiner

*Primary Examiner*—Thi Dang
(74) *Attorney, Agent, or Firm*—Barnes & Thornburg

(57) ABSTRACT

The invention provides microwave plasma process apparatus and method in which an antenna having a tubular member curved in a circular shape and including at least one slit is disposed on a sealing member for sealing a chamber, so that microwaves can be emitted through the slit to the sealing member.

25 Claims, 21 Drawing Sheets

APPARATUS AND METHOD FOR MICROWAVE PLASMA PROCESS

BACKGROUND OF THE INVENTION

The present invention relates to an apparatus and a method for conducting a process such as etching, ashing and depositing on a semiconductor substrate or an LCD glass plate by plasma generated by using microwave energy.

Plasma generated by externally applying an energy to a reaction gas is widely used in manufacture processes for LSIs and LCDs. In particular, the usage of plasma is an indispensable basic technique in a dry etching process and chemical vapor deposition.

FIG. 1 is a side sectional view of a conventional microwave plasma process apparatus and FIG. 2 is a plan view of the plasma process apparatus of FIG. 1. A reactor 31 in the shape of a rectangular box is made from aluminum. The reactor 31 is provided with a microwave introducing window at its upper portion, and the microwave introducing window is airtightly sealed with a sealing plate 34. The sealing plate 34 is made from a dielectric material, such as quartz glass and alumina, having heat resistance, microwave penetrability and a small dielectric loss.

The reactor 31 is coupled with a cover 40 in the shape of a rectangular box covering the upper portion of the reactor 31. A dielectric plate 41 is disposed on the ceiling within the cover 40, and an air gap 43 is provided between the dielectric plate 41 and the sealing plate 34. The dielectric plate 41 is formed out of a plate of a dielectric material, for example, a fluororesin such as Teflon (registered trademark), a polyethylene resin or a polystyrene resin in a substantially pentagonal shape, obtained by combining a rectangle and a triangle, provided with a projection on its apex. The projection on the apex of the dielectric plate 41 is fit in a waveguide 21 coupled with the cover 40. The waveguide 21 is connected with a microwave oscillator 20, so that a microwave oscillated by the microwave oscillator 20 can be guided by the waveguide 21 so as to enter the projection of the dielectric plate 41.

As described above, the base portion of the projection of the dielectric plate 41 is formed as a taper portion 41a in a substantially triangle shape in a plan view. The microwave having entered the projection is expanded in the lateral direction along the taper portion 41a and propagated in the entire dielectric plate 41. The microwave is reflected on the end face of the cover 40 opposing the waveguide 21, so that the incident wave and the reflected wave can be superimposed so as to generate a standing wave in the dielectric plate 41.

The inside of the reactor 31 works as a process chamber 32, and a desired gas is introduced into the process chamber 32 through a gas inlet tube 35. At the center of the bottom of the process chamber 32, a table 33 for placing a sample W is disposed, and the table 33 is connected through a matching box 36 with a high frequency power supply 37. The bottom of the reactor 31 is also provided with an air outlet 38, so as to exhaust the air within the process chamber 32 through the air outlet 38.

In conducting an etching process on the surface of the sample W by using this microwave plasma process apparatus, the pressure within the process chamber 32 is decreased down to a desired pressure by exhausting through the air outlet 38, and then, a reaction gas is supplied to the process chamber 32 through the gas inlet tube 35. Subsequently, a microwave is oscillated by the microwave oscillator 20, and the oscillated microwave is introduced into the dielectric plate 41 through the waveguide 21. At this point, the microwave is uniformly expanded within the dielectric plate 41 owing to the taper portion 41a, thereby generating a standing wave in the dielectric plate 41. This standing wave forms a leakage electric field below the dielectric plate 41, and the leakage electric field is introduced into the process chamber 32 through the air gap 43 and the sealing plate 34. In this manner, the microwave is propagated to the process chamber 32. As a result, plasma is generated in the process chamber 32, and the surface of the sample W is etched by using the plasma.

The conventional microwave plasma process apparatus includes the taper portion 41a projecting from the edges of the sealing plate 34 and the reactor 31 in the horizontal direction in order to uniformly expand the microwave in the dielectric plate 41. The dimension of the taper portion 41a is defined in accordance with the area of the dielectric plate 41, namely, the dimension of the process chamber 32. Accordingly, when the conventional microwave plasma process apparatus is to be installed, an additional horizontally extending space is required for the taper portion 41a projecting from the edge of the reactor 31.

In accordance with the dimensional increase of the sample W, there is a demand for a microwave plasma process apparatus including the reactor 31 with a further larger dimension. At the same time, there is a demand that the entire apparatus can be installed in a space as small as possible. However, since the dimension of the taper portion 41a of the conventional apparatus is defined in accordance with the dimension of the reactor 31, the dimension of the taper portion 41a increases as the dimension of the reactor 31 increases. Accordingly, the two demands that a microwave plasma process apparatus including a larger reaction vessel 31 is to be installed in a space as small as possible cannot be satisfied at the same time.

BRIEF SUMMARY OF THE INVENTION

The present invention was devised to overcome the aforementioned conventional problems, and an object of the invention is providing a microwave plasma process apparatus which can be minimized in its size, with retaining a large dimension of a reactor included therein, so as to be installed in a small space.

Another object of the invention is providing a microwave plasma process apparatus in which the uniformly process can be executed even when a distance between an antenna and a sample is small.

Still another object of the invention is providing a microwave plasma process apparatus in which the process speed can be improved.

Still another object of the invention is providing a microwave plasma process apparatus in which a usage efficiency of a reaction gas can be improved.

The microwave plasma process apparatus of this invention comprises a chamber being sealed with a sealing member; a gas inlet tube for introducing a gas into the chamber; and an antenna opposing a surface of the sealing member, and the antenna includes a tubular member in a circular shape for propagating the microwaves; an entrance disposed on a circumferential face of the tubular member for introducing the microwaves into the tubular member; and a slit formed in a portion of the tubular member opposing the sealing member.

In the microwave plasma process method of this invention, a plasma process is conducted by using the aforementioned apparatus.

The microwaves entered the antenna from the entrance propagate through the antenna as progressive waves progressing in the mutually reverse directions through the tubular member of the antenna, and come into collision with each other in a position opposing the entrance of the tubular member. Thus, standing waves are generated.

The standing waves allow a current having a maximum value at predetermined intervals to flow in the wall of the tubular member. The slit is formed in the portion of the tubular member opposing the sealing member, and the current causes a potential difference between the inside and the outside of the tubular member at both sides of the slit. An electric field is emitted through the slit to the sealing member owing to this potential difference. In this manner, the microwaves are propagated from the antenna to the sealing member. The microwaves transmit the sealing member and are introduced into the chamber, where plasma is generated by using the microwaves.

In this manner, the microwaves can directly enter the tubular member of the antenna, and hence, the antenna can be prevented from projecting from of the chamber, resulting in decreasing the horizontal dimension of the microwave plasma process apparatus. On the other hand, since the microwaves are introduced from the antenna to the entire area above the chamber and emitted through the slit, the microwaves can be uniformly introduced into the chamber. Furthermore, by adjusting the inside diameter of the tubular member at a predetermined dimension, a standing wave in a single mode (basic mode) can be generated in the antenna. As a result, the energy loss can be minimized.

In one aspect of the microwave plasma process apparatus, the slit is plural in number and the plural slits are formed at predetermined intervals from a position where the microwaves simultaneously progressing through the tubular member in reverse directions from the entrance come into collision with each other.

Accordingly, the microwaves are radially introduced into the chamber through the plural slits formed in the circular antenna at appropriate intervals, and hence, substantially uniform plasma can be generated in the chamber. Thus, a target with a large diameter can be substantially uniformly treated with the plasma.

In another aspect of the microwave plasma process apparatus, the slit is plural in number and a distance L between adjacent slits is determined in accordance with the following expression:

$$L = m \cdot \lambda g/2$$

wherein m indicates an integer and $\lambda g$ indicates a wavelength of the microwaves propagated through the antenna.

In still another aspect of the microwave plasma process apparatus, a slit is formed in a position away from the position where the microwaves come into collision with each other by a distance of $(2n-1) \cdot \lambda g/4$ and another slit is formed in a position away from the slit by a distance of $m \cdot \lambda g/2$, wherein m and n indicate integers and $\lambda g$ indicates a wavelength of the microwaves propagated through the antenna.

Accordingly, the current flowing in the wall of the tubular member owing to the standing waves generated in the tubular member of the antenna has a maximum value in two positions away, in the circumferential direction of the tubular member, from the position where the above-described progressive waves come into collision with each other by a distance of $\lambda g/4$, and also has the maximum value in positions away from these two positions at intervals of $\lambda g/2$.

Therefore, in the case where the slit is formed in the position away from the position where the progressive waves come into collision by the distance of $(2n-1) \cdot \lambda g/4$ and another slit is formed at intervals of $m \cdot \lambda g/2$ from the former slit, the microwaves can be emitted through the slits with the energy loss minimized.

In still another aspect of the microwave plasma process apparatus, a center line of the tubular member which passes through center points of sections of the tubular member taken on a plane including a center axis of the circular shape of the tubular member has a length given by a substantially integral multiple of a wavelength of the microwaves propagated through the antenna.

Accordingly, since the length of the center line is substantially equal to the integral multiple of the wavelength of the microwaves propagated through the antenna, the microwaves are resonated within the antenna. As a result, the amplitude of the standing waves generated in the antenna can be increased, and the microwaves with high electric field can be emitted through the slit into the chamber.

In still another aspect of the microwave plasma process apparatus, a dielectric is fit in the tubular member.

Accordingly, the wavelength of the microwaves having entered the antenna is decreased by $1/\sqrt{\in r}$ (wherein $\in r$ indicates a dielectric constant of the dielectric). Therefore, in using the tubular member having the same diameter, the number of positions corresponding to the maximum current value of the current flowing in the wall of the tubular member is larger when the dielectric is fit than when the dielectric is not fit, and hence, the number of the slits can be increased accordingly. As a result, the microwaves can be more uniformly introduced into the chamber.

In still another aspect of the microwave plasma process apparatus, the entrance is plural in number and provided on a circumferential face of the tubular member for allowing the microwaves to enter the tubular member through the plural entrances.

In some cases, a microwave emitted into the chamber through a slit disposed on the other side of the circular center of the tubular member from the entrance has lower energy than a microwave emitted through another slit. In such cases, the lower energy of the microwave can be compensated by disposing two entrances on the circumference of the tubular member so as to oppose each other. As a result, the microwaves can be uniformly introduced into the chamber.

Also, when another entrance is disposed in one or more positions away in the circumferential direction of the tubular member from one entrance by a distance of $k \cdot \lambda g/2$ (wherein k is an integer and $\lambda g$ indicates the wavelength of the microwaves propagated through the antenna), the energy of the microwaves emitted from the tubular member into the chamber can be adjusted in a predetermined position along the circumferential direction of the tubular member.

In still another aspect of the microwave plasma process apparatus, a through hole penetrating the sealing member is formed in an area of the sealing member surrounded with the antenna, and a tube for introducing the gas is fit in the through hole.

In one aspect of the microwave plasma process method of this invention, the plasma process is conducted by using the aforementioned apparatus.

Accordingly, the reaction gas is radially and substantially uniformly diffused from the center toward the entire periphery of the chamber, resulting in substantially uniformly etching the target with the plasma. Also, the reaction gas supplied to the chamber remains in the plasma for a long period of time, and hence, the usage efficiency of the reaction gas can be improved.

The microwave plasma process apparatus can further comprises an electrode disposed in an area on the sealing member surrounded with the antenna and electrically insulated from the antenna.

In another aspect of the microwave plasma process method of this invention, the plasma process is conducted by using the aforementioned apparatus.

Moreover, the microwave plasma process apparatus can further comprises a power supply for applying an AC field of a high frequency to the electrode.

By applying a high frequency electric field of, for example, approximately 13.56 MHz to the electrode, plasma can be generated in an area opposing the electrode within the chamber. Since the plasma can be generated in and around the area opposing the electrode within the chamber in this manner, the plasma can be sufficiently diffused even when a distance between the antenna and the target is small, and the generated plasma can be made substantially uniform on the same plane as the target. Accordingly, the dimension, in particular, the vertical dimension of the microwave plasma process apparatus can be decreased. Also, a desired plasma process can be conducted at a high rate.

Moreover, since the plasma can be generated separately from the plasma generated by using the microwaves emitted from the antenna, the plasma process speed at the center and at the edge of the target can be made uniform by controlling the power of the high frequency electric field applied to the electrode without adjusting the power of the microwaves emitted from the antenna.

In addition, the microwave plasma process apparatus can further comprises a power supply for applying an AC field of a low frequency to the electrode.

Accordingly, in addition to the plasma generation in an area opposing the antenna within the vessel by using the microwaves oscillated into the antenna, the low frequency electric field of 200 KHz through 2 MHz, and preferably, of 400 KHz field, is applied to the electrode. Therefore, positively charged ions included in the plasma are moved toward the center of the circular shape of the antenna when the field is negative, and are moved in the reverse direction when the field is positive. As a result, the diffusion efficiency of the plasma can be improved with stably retaining the state of the generated plasma, and substantially uniform plasma can be obtained on the same plane as the target even when the distance between the antenna and the target is small. Accordingly, the vertical dimension of the microwave plasma process apparatus can be decreased and a desired plasma process can be conducted at a high rate.

In general, in anisotropic etching having directivity in a direction along the thickness of a target, ions included in plasma are introduced onto the target by applying a low frequency bias ($V_a \sin(\omega t)$, wherein $\omega$ indicates an angular frequency and t indicates time) to a table for placing the target within a chamber. At this point, a bias ($-V_b \sin(\omega t)$) reverse to the low frequency bias applied to the table is applied to the electrode. As a result, the ions included in the plasma receive a potential of ($V_a + V_b$) at the center of the table, resulting in improving the anisotropy in the etching process.

Moreover, the microwave plasma process apparatus can further comprises a power supply for applying a DC field to the electrode.

Accordingly, in addition to the plasma generation in the area opposing the antenna within the chamber by using the microwaves oscillated into the antenna, the negative DC field is applied to the electrode. Therefore, the positively charged ions included in the plasma are moved toward the center of the circular shape of the antenna, resulting in making the plasma uniform. As a result, the distance between the antenna and the target can be decreased, and hence, the dimension of the microwave plasma process apparatus can be further decreased. In addition, the plasma process speed can be improved.

Moreover, the microwave plasma process apparatus can further comprises a waveguide connected with an area on the sealing member surrounded with the antenna; and a microwave oscillator for oscillating a microwave into the waveguide.

In still another aspect of the microwave plasma process method of this invention, the plasma process is conducted by using the aforementioned apparatus.

Since the plasma is generated separately by introducing the microwave from the waveguide into the chamber, the plasma can be generated in and around an area opposing the opening of the waveguide within the chamber. Therefore, even when the distance between the antenna and the target is small, the plasma can be sufficiently diffused and made uniform on the same plane as the target. As a result, the dimension, in particular, the vertical dimension of the microwave plasma process apparatus can be further decreased, and a desired plasma process can be conducted at a high speed.

In addition, since the plasma can be generated separately from the plasma generated by using the microwaves emitted from the antenna, the plasma process speed at the center and at the edge of the target can be made uniform by controlling the power of the microwave introduced into the waveguide without adjusting the power of the microwaves emitted from the antenna.

Moreover, the microwave plasma process apparatus can further comprises a gas inlet tube, for introducing the gas into the chamber, penetrating a space between the waveguide and the area on the sealing member surrounded with the antenna.

Accordingly, the gas is radially diffused from the center toward the entire periphery of the chamber, and the plasma can be generated in a substantially uniform density in plural positions along the diametral direction of the chamber. Thus, the entire surface area of the target can be treated at a uniform speed.

Also, most of the gas is supplied to the plasma generated in the chamber and the supplied gas remains within the plasma for a long period of time. Accordingly, the usage efficiency of the gas can be improved. On the other hand, since the gas inlet tube is disposed in the area of the sealing member surrounded with the antenna, the gas inlet tube does not harmfully affects the microwaves propagated through the antenna.

The above and further objects and features of the invention will more fully be apparent from the following detailed description with accompanying drawings.

DETAILED DESCRIPTION OF THE INVENTION

Preferred embodiments of the invention will now be described with reference to the accompanying drawings.
Embodiment 1

Figure 1:
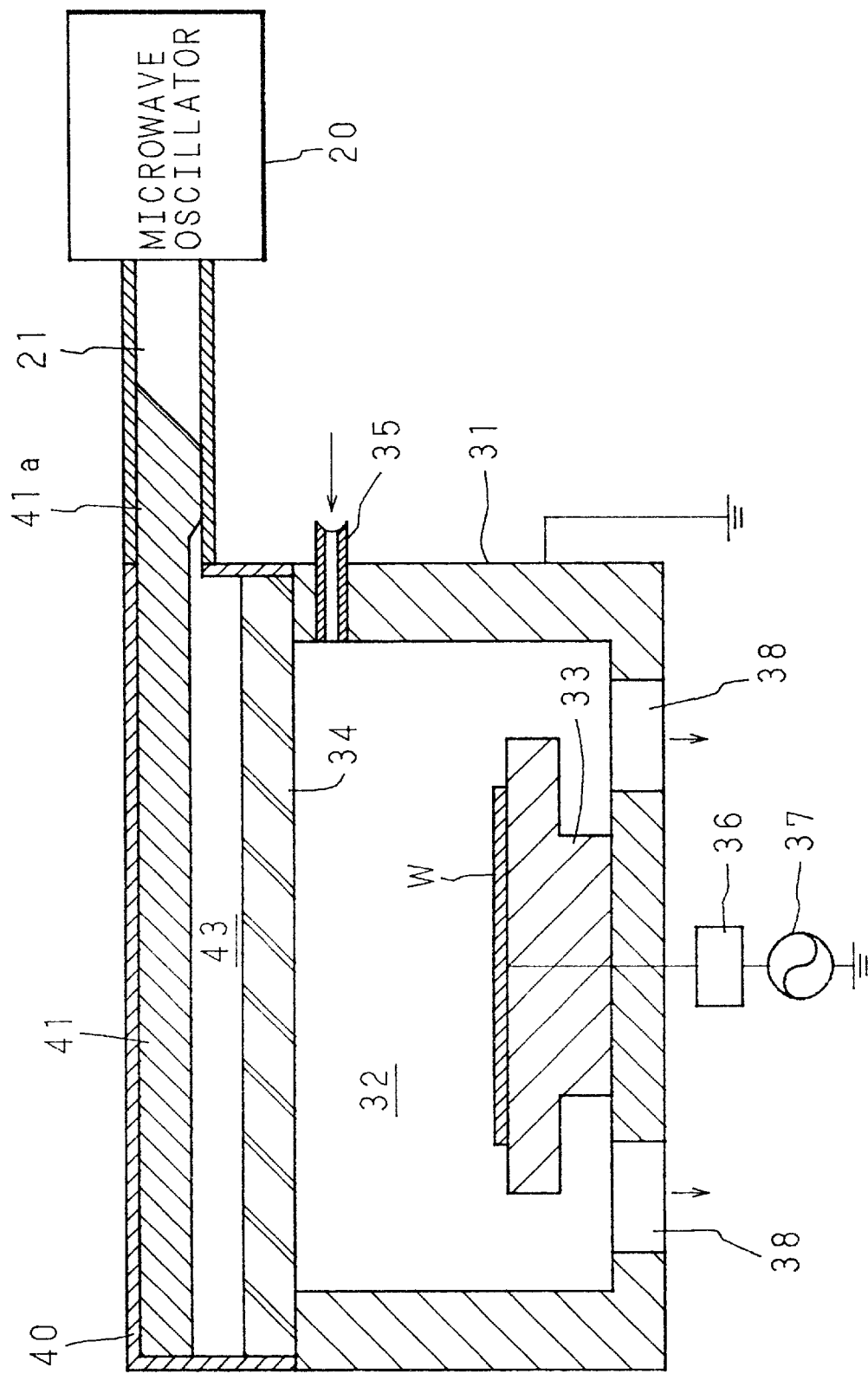
FIG. 1 is a side sectional view of a conventional microwave plasma process apparatus.
Figure 2:
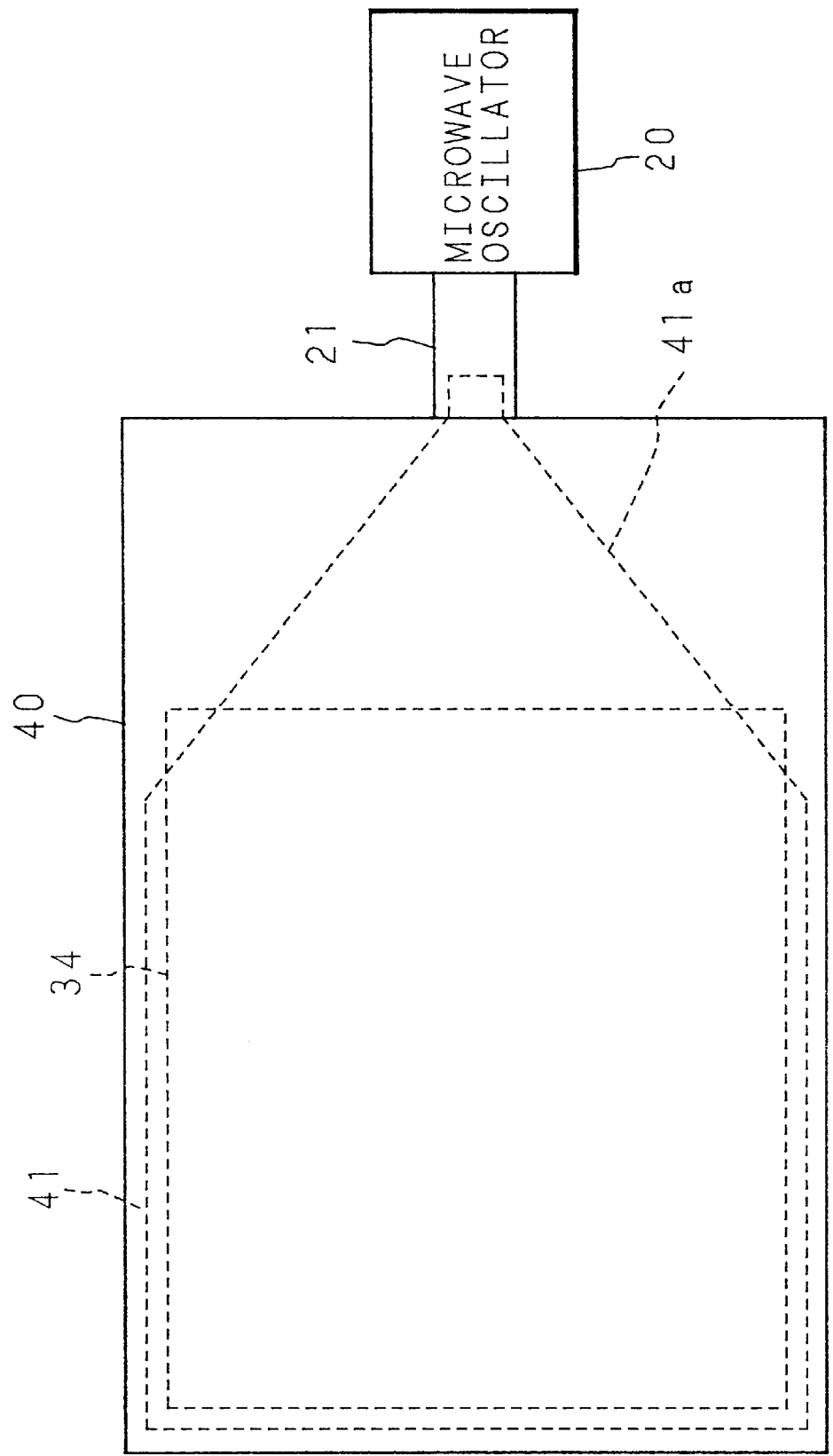
FIG. 2 is a plan view of the plasma process apparatus of FIG. 1.
Figure 3:
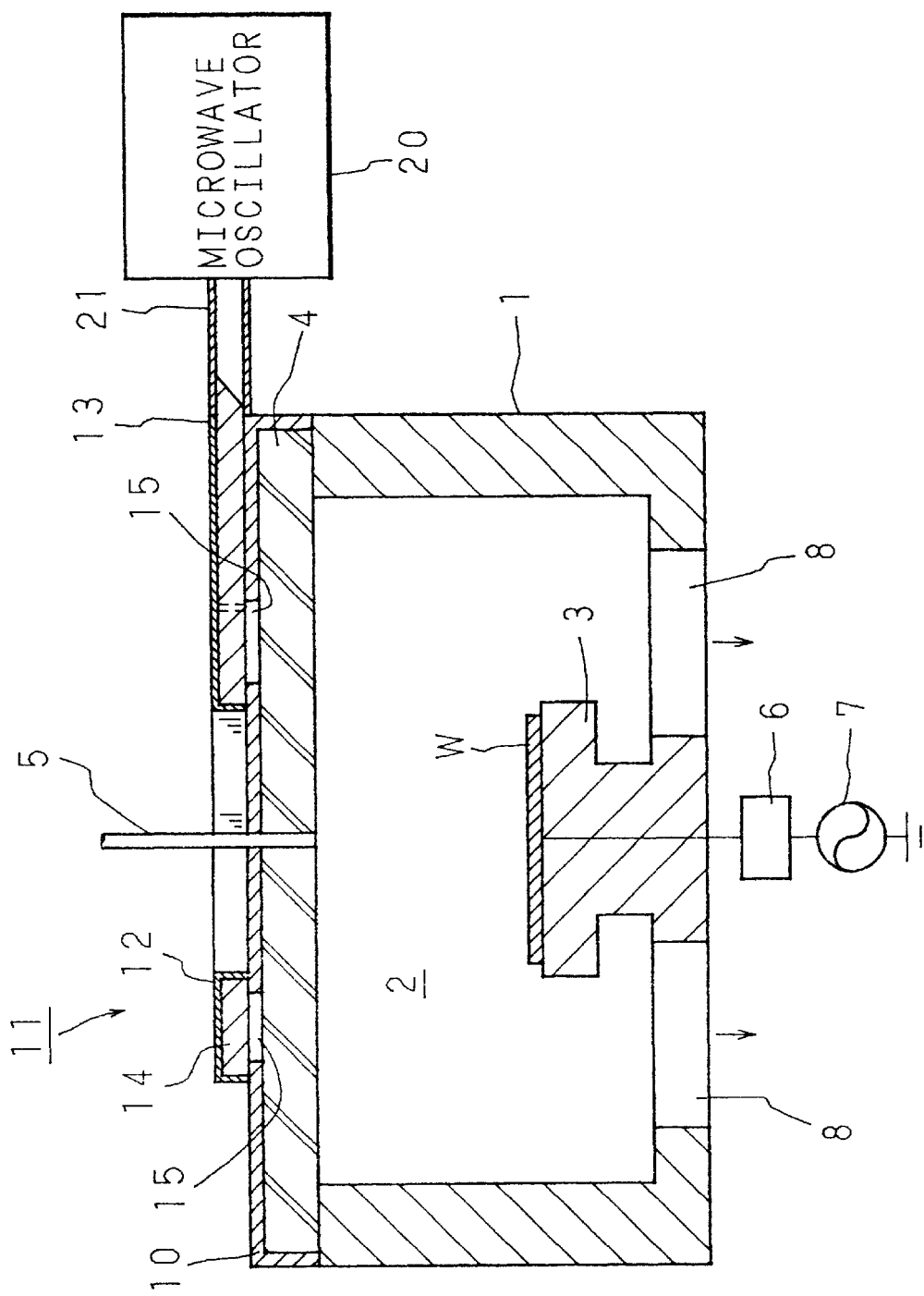
FIG. 3 is a side sectional view for showing the structure of a microwave plasma process apparatus according to a first embodiment of the invention.
Figure 4:
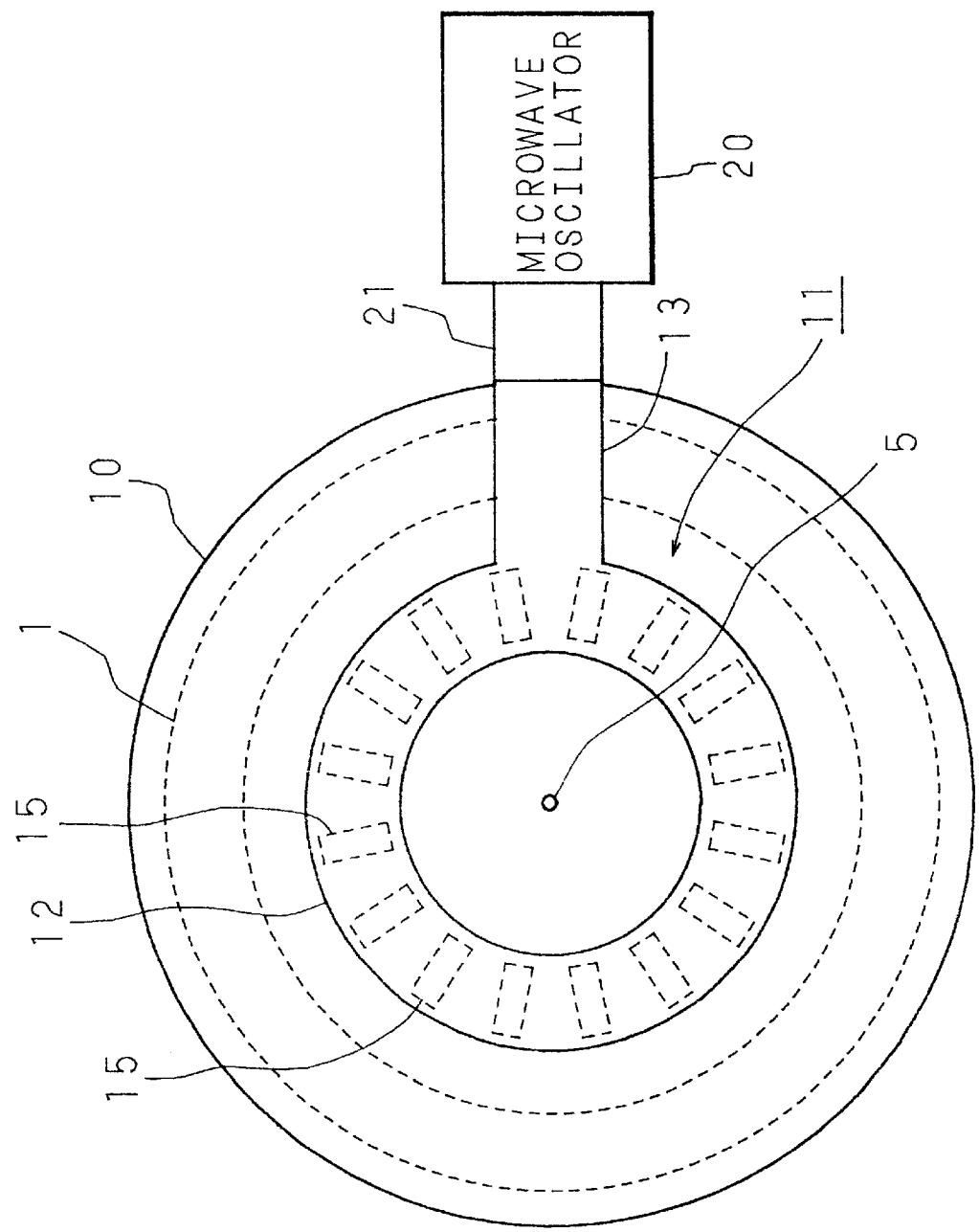
FIG. 4 is a plan view of the microwave plasma process apparatus of FIG. 3.

FIG. 3 is a side sectional view for showing the structure of a microwave plasma process apparatus according to a first embodiment of the invention, and FIG. 4 is a plan view of the microwave plasma process apparatus of FIG. 3. A reactor 1 in the shape of a bottomed cylinder is made from aluminum. The reactor 1 is provided with a microwave introducing window in its upper portion, and the microwave introducing window is airtightly sealed with a sealing plate 4. The plate 4 is made from a dielectric material, such as quartz glass and alumina, having heat resistance, microwave transmission and a small dielectric loss.

The upper face and the outer circumferential face of the plate 4 are covered with a cover 10 of a conductive metal in the shape of a circular cap, and the cover 10 is fixed on the reactor 1. An antenna 11 is set on the upper face of the cover 10 for introducing microwaves into the reactor 1. The antenna 11 is fixed on the upper face of the cover 10. And the antenna 11 includes a circular waveguide antenna part 12 formed in a circular shape. Plural slits 15 are disposed in portions of the cover 10 opposing the circular part 12.

The circular part 12 is disposed in a portion slightly inside of the inner circumferential face of the reactor 1 to be coaxial with the center axis of the reactor 1. An opening (entrance) provided on the outer circumferential face of the circular part 12 is connected with an introducing part 13 for introducing microwaves into the circular part 12, so that the introducing part 13 can extend along the diametral direction of the circular part 12. A dielectric 14 of a fluororesin such as Teflon (registered tradename), a polyethylene resin or a polystyrene resin (preferably Teflon) is fit in the introducing part 13 and the circular part 12.

The introducing part 13 is connected with a waveguide 21, and the waveguide 21 is connected with a microwave oscillator 20. Microwaves oscillated by the microwave oscillator 20 are guided by the waveguide 21 so as to enter the introducing part 13. The microwaves are introduced through the introducing part 13 into the circular part 12. The microwaves are propagated in the dielectric 14 fit in the circular part 12 as progressive waves progressing in mutually reverse directions in the circular part 12. These progressive waves come into collision in a position opposing the opening of the circular part 12, thereby generating standing waves. The standing waves allow a current having a maximum value at predetermined intervals to flow in the inner face of the circular part 12.

At this point, the dimension of the circular part 12 is defined as a height of 27 mm and a width of 66.2 mm in accordance with the frequency of the microwaves, that is, 2.45 GHz, so that a mode of the microwaves propagated through the circular part 12 can be placed in the rectangular TE10 mode, that is, a basic propagation mode. A microwave in this mode can be propagated through the dielectric 14 fit in the circular part 12 with scarcely losing its energy.

The plate 4 has a diameter of 380 mm. And Teflon (registered trade name) with ∈r of 2.1 is fit in the circular part 12. And a circle C (illustrated in FIG. 5) formed along the lateral center of the circular part 12 has a diameter D (illustrated in FIG. 5) of 282 mm. In this case, the circumferential length of the circle C, that is, approximately 886 mm, is given by a substantially integral multiple of the wavelength of the microwaves propagated through the circular part 12, that is, approximately 110 mm. Accordingly, the microwaves are resonated in the circular part 12, so that the standing waves can attain a high voltage at a low current level at its loop and a low voltage at a high current level at its node. As a result, the Q-value of the antenna can be improved.

Figure 5:
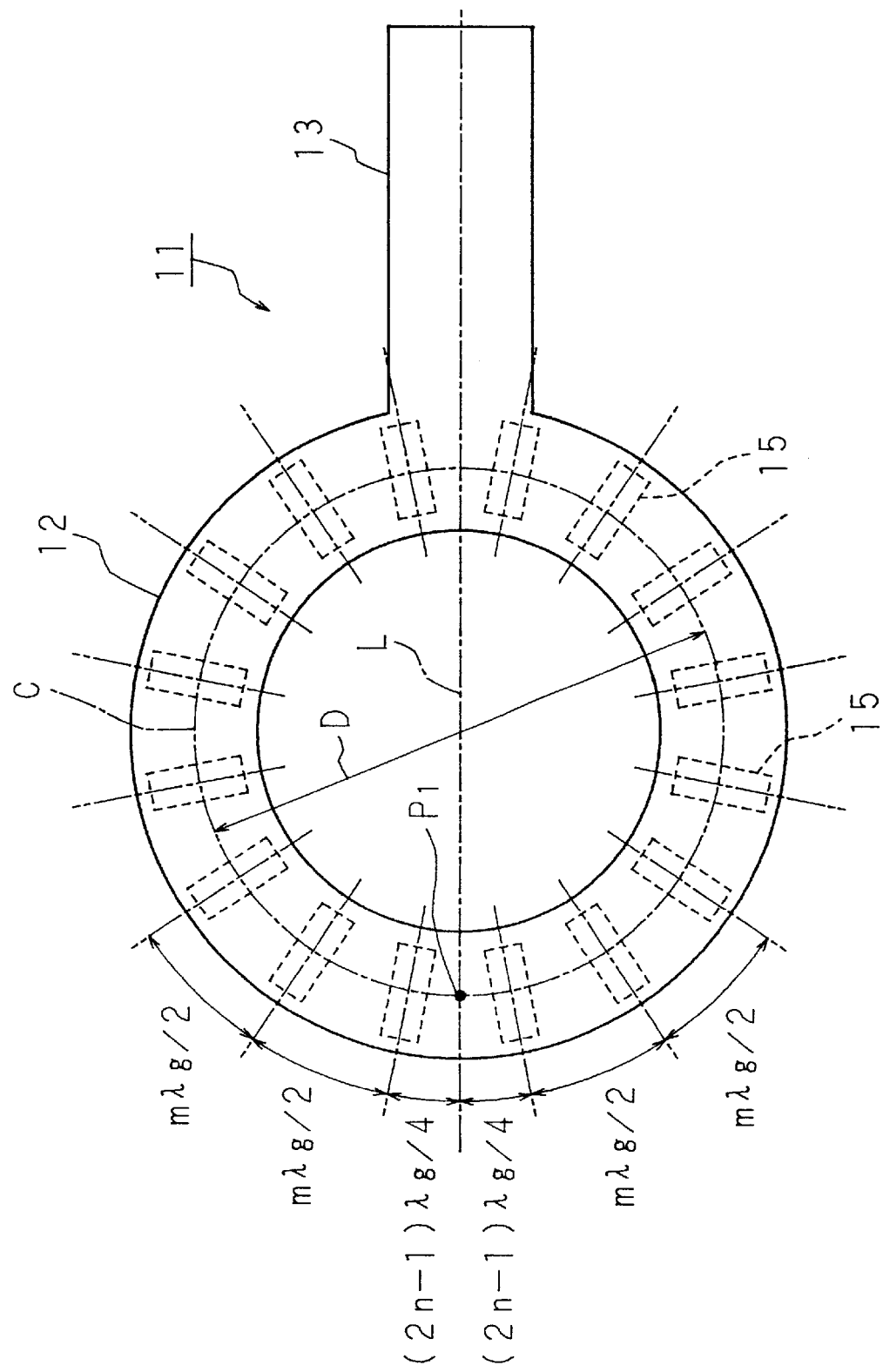
FIG. 5 is an explanatory diagram for illustrating a structure of slits shown in FIGS. 3 and 4.

FIG. 5 is an explanatory diagram for illustrating the slits 15 shown in FIGS. 3 and 4. As is shown in FIG. 5, each of the rectangular slits 15 is formed so as to extend along the diametral direction of the circular part 12, namely, perpendicularly to the progressing direction of the microwaves propagated through the circular part 12. Each slit 15 has a length of 50 mm and a width of 20 mm.

The slits 15 are positioned as follows: Among two intersections between the circle C and an extension line L obtained by extending the center line of the introducing part 13, one away from the introducing part 13 is indicated as an intersection $P_1$. Two slits 15 are disposed in positions away from the intersection $P_1$ in the both directions along the circle C by a distance of $(2n-1) \cdot \lambda g/4$ (wherein n is an integer and $\lambda g$ indicates the wavelength of the microwaves propagated through the antenna). The other plural slits 15 are formed in positions away from these two slits 15 in the both directions along the circle C by distances of $m \cdot \lambda g/2$ (wherein m is an integer).

Figure 6:
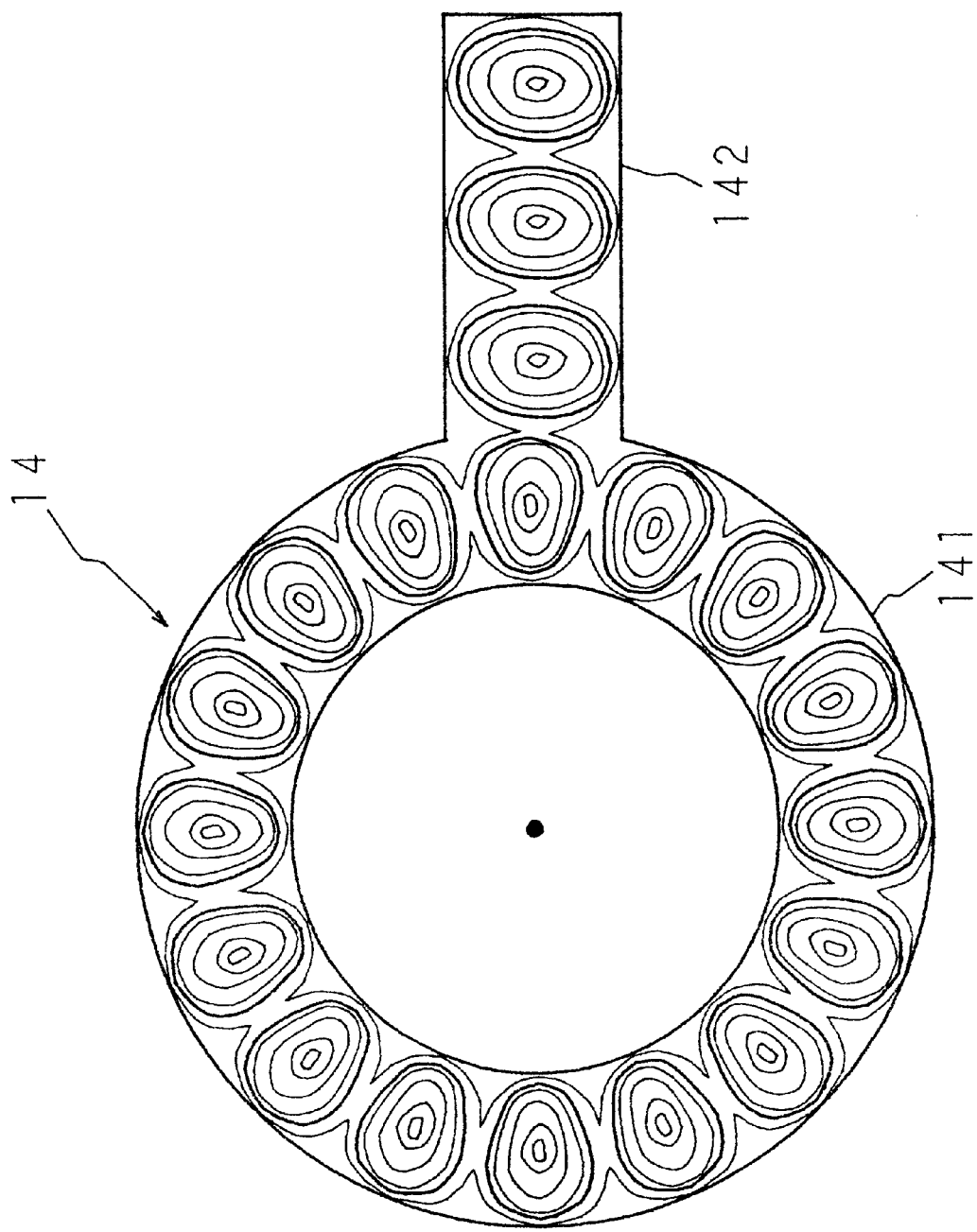
FIG. 6 is an explanatory diagram for illustrating the field intensity distributed in a dielectric within an antenna shown in FIG. 4.

FIG. 6 is an explanatory diagram for illustrating a field intensity distributed in the dielectric 14 within the circular part 12 of FIG. 4, which is obtained through simulation as follows: The dielectric is obtained by forming Teflon into a shape including a circular portion 141 provided with a rod portion 142 on the outer circumference of the circular portion 141. Microwaves with the frequency of 2.45 GHz is introduced into this dielectric from the end of the rod portion 142. The intensity of an electric field formed through the propagation of the microwaves is simulated, and points having the same field intensity are linked. As a result, as is shown in FIG. 6, plural areas with a strong electric field are formed in the dielectric symmetrically about an axis passing through the center of the circular portion 141 and the center of the rod portion 142.

The slits 15 are formed so as to be positioned between the areas with the high electric field. Therefore, the high electric field can break through the slits so as to be introduced into the reactor 1 through the plate 4. In this manner, the microwaves for generating plasma are introduced into the reactor 1.

Figure 7:
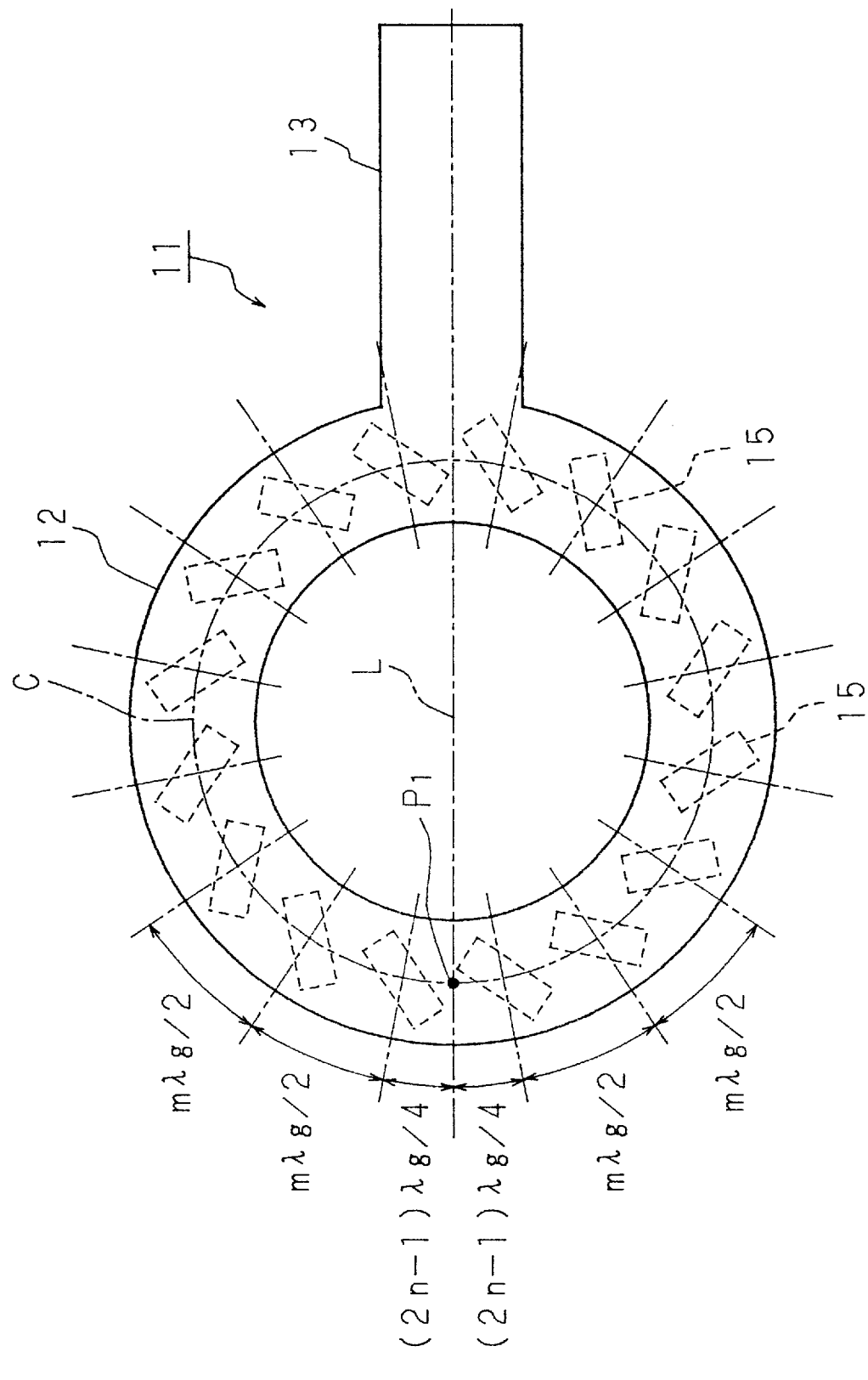
FIG. 7 is an explanatory diagram for illustrating another structure of the slits.
Figure 8:
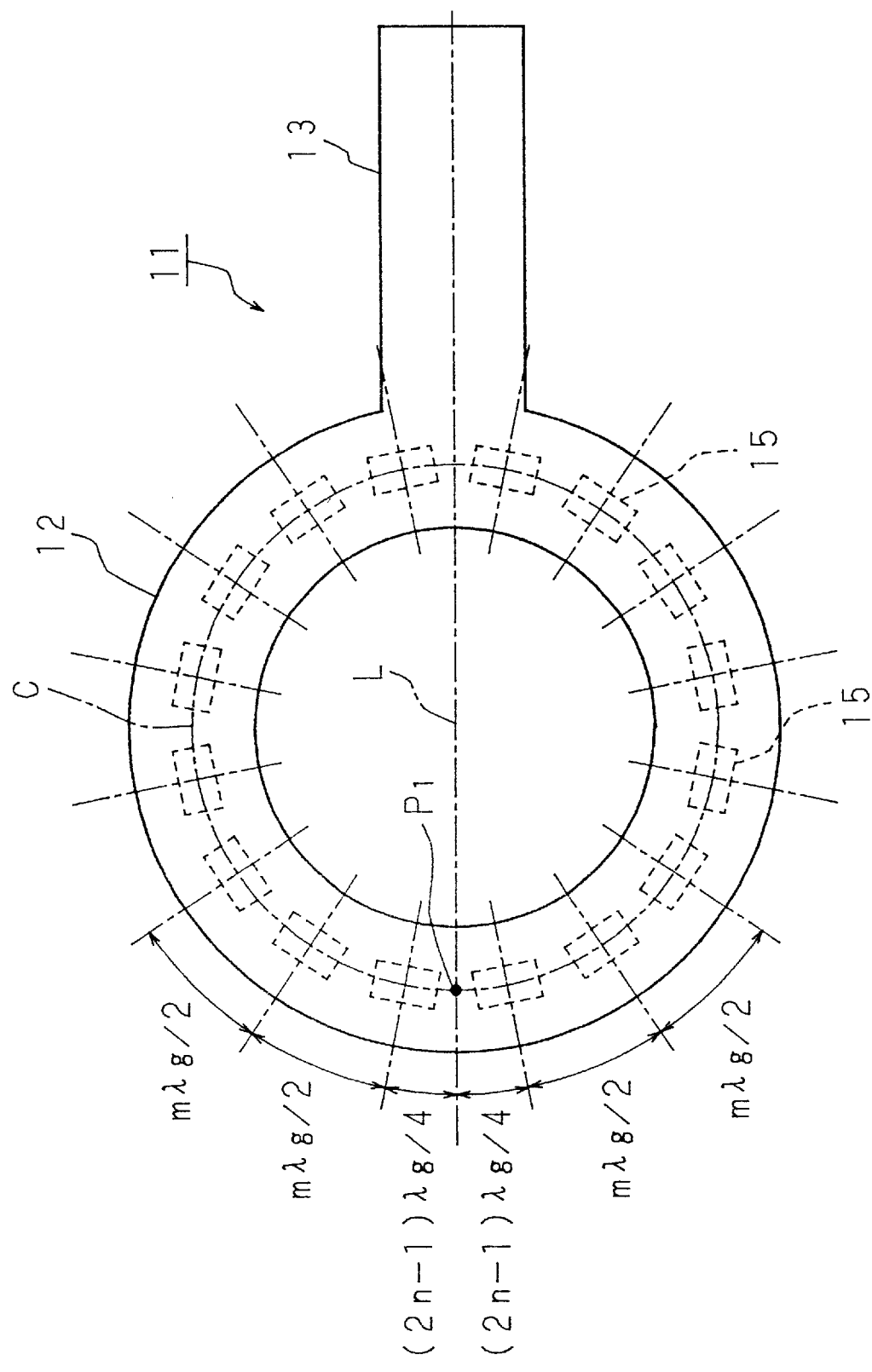
FIG. 8 is an explanatory diagram for illustrating still another structure of the slits.

In this embodiment, the slits 15 are formed so as to extend perpendicularly to the progressing direction of the microwaves propagated through the circular part 12, which does not limit the invention. The slits can be formed so as to diagonally cross the progressing direction of the microwaves as is shown in FIG. 7, or so as to extend along the progressing direction of the microwaves as is shown in FIG. 8. In some cases, the plasma generated in the reactor 1 changes the wavelength of the microwaves propagated through the antenna 11, resulting in changing the positions corresponding to the maximum value of the current flowing in the wall of the circular part 12. However, when the slits are formed so as to diagonally cross or extend along the progressing direction of the microwaves, such a change of the positions corresponding to the maximum value of the current can be covered.

As described above, the slits 15 are substantially radially formed on the cover 10, and hence, the microwaves can be uniformly introduced into the entire reactor 1. And, since the antenna 11 is disposed on the cover 10 having the same diameter as the reactor 1 without projecting from the edge of the cover 10 as is shown in FIG. 3, even when the reactor 1 has a large diameter, the entire dimension of the microwave plasma process apparatus can be made small. Accordingly, the apparatus can be installed in a small space.

The cover 10 is provided, at substantially the center thereof, with a through hole penetrating the cover 10 and the plate 4, so that gasses can be introduced into a process chamber 2 through a gas inlet tube 5 fit in the through hole. At the center of the bottom of the chamber 2, a table 3 for placing a sample W is set, and the table 3 is connected with a high frequency poser supply 7 through a matching box 6. Also, the bottom of the reactor 1 is provided with an air outlet 8, through which the air within the chamber 2 can be exhausted.

When the surface of the sample W is to be etched by using this microwave plasma process apparatus, the pressure within the chamber 2 is decreased to a desired pressure by exhausting through the air outlet 8, and then a reaction gas is supplied through the gas inlet tube 5 into the chamber 2.

Subsequently, microwaves are oscillated by the microwave oscillator 20, the microwaves are introduced through the waveguide 21 into the antenna 11, where standing waves are generated. The electric field emitted from each of the slits 15 of the antenna 11 is introduced into the chamber 2 through the plate 4. Thus, plasma is generated in the chamber 2, and the surface of the sample W is etched by using the plasma.

As described above, since the reaction gas is supplied to the chamber 2 through the gas inlet tube 5 connected at substantially the center of the cover 10, the reaction gas is radially diffused from substantially the center of the chamber 2 toward the entire periphery. Therefore, the reaction gas flows uniformly above the sample W, and hence, the entire surface of the sample W can be etched at a substantially uniform rate. Furthermore, most of the reaction gas is supplied to the plasma generated in the chamber 2 and the supplied reaction gas remains in the plasma for a comparatively long period of time. Accordingly, the usage efficiency of the reaction gas can be improved.

Embodiment 2

Figure 9:
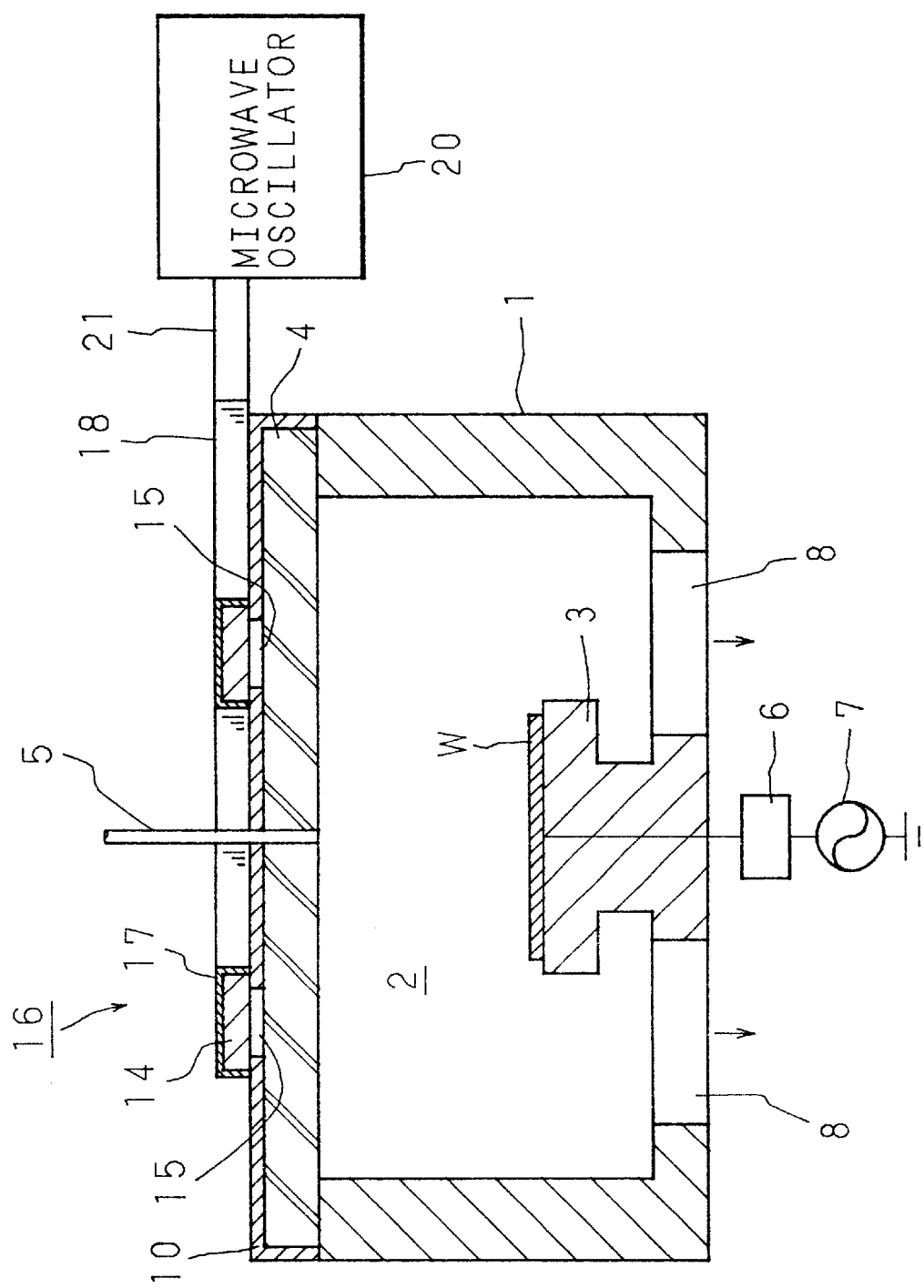
FIG. 9 is a side sectional view for showing the structure of a microwave plasma process apparatus according to a second embodiment of the invention.
Figure 10:
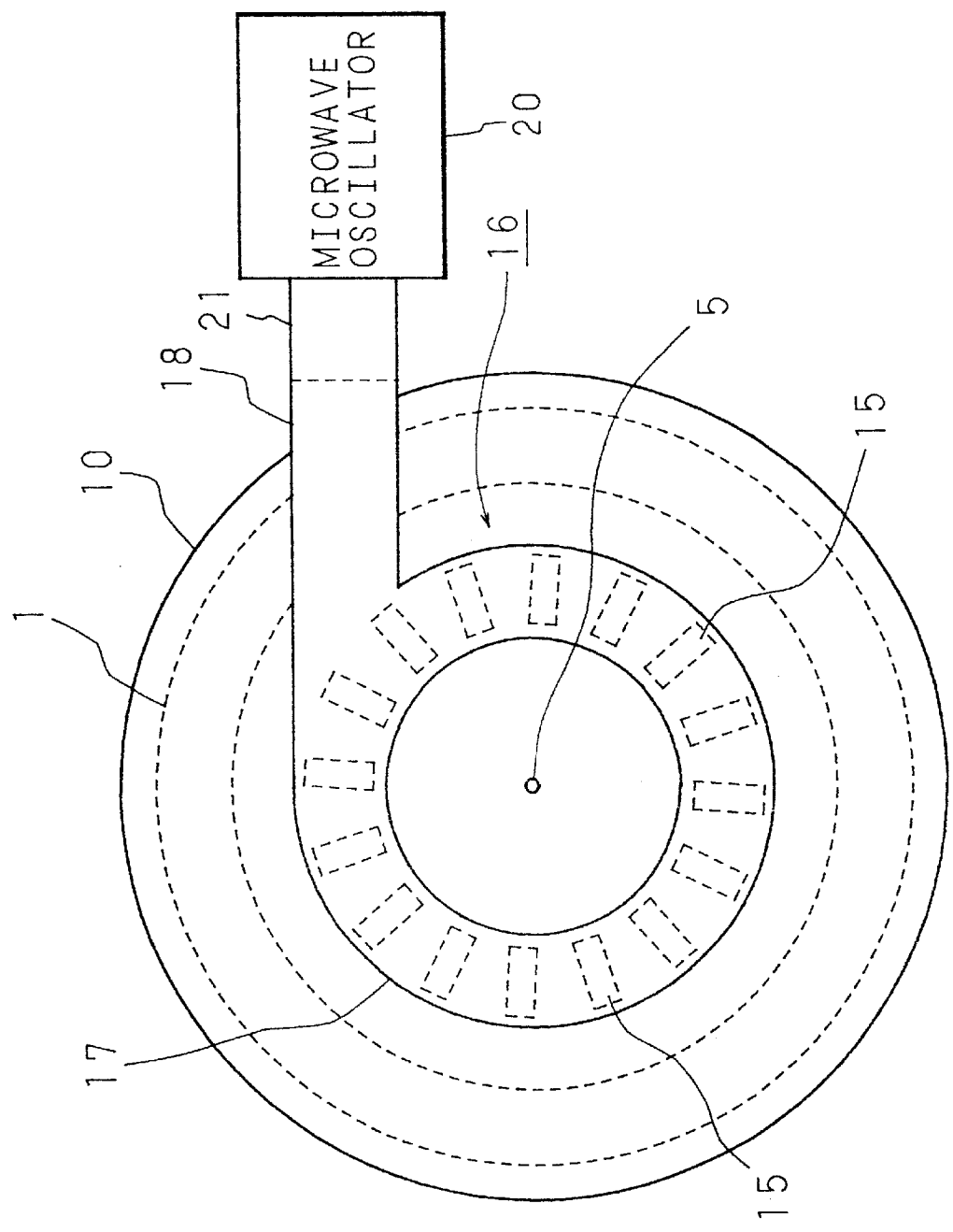
FIG. 10 is a plan view of the microwave plasma process apparatus of FIG. 9.
Figure 11:
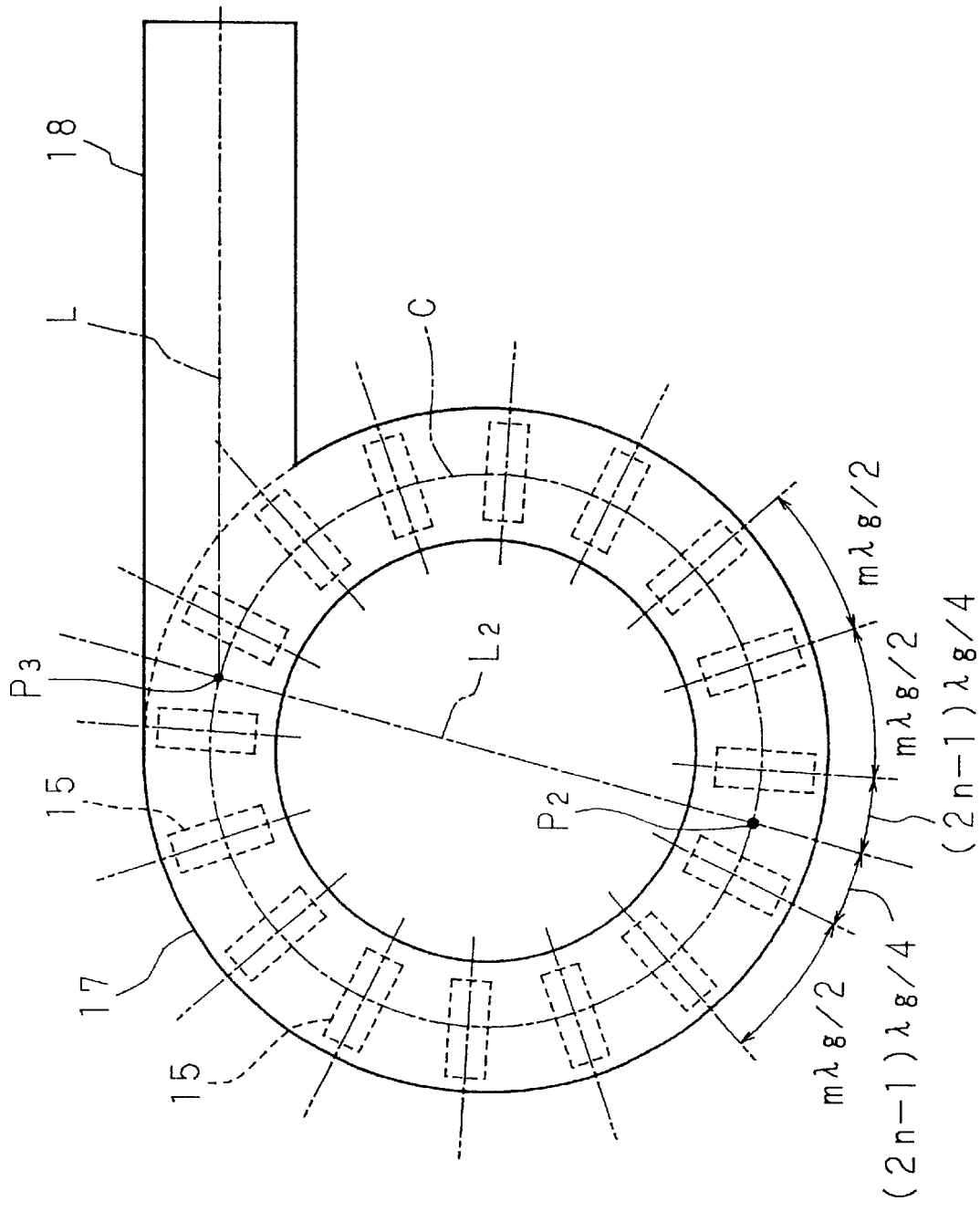
FIG. 11 is an explanatory diagram for illustrating the structure of slits shown in FIGS. 9 and 10.

FIG. 9 is a side sectional view of a microwave plasma process apparatus according to a second embodiment, wherein the introducing part is connected with the circular waveguide antenna part in a different position. FIG. 10 is a plan view of the microwave plasma process apparatus of FIG. 9, and FIG. 11 is an explanatory diagram for illustrating slits 15 shown in FIGS. 9 and 10. In FIGS. 9 through 11, like reference numerals are used to refer to like elements shown in FIGS. 3 through 5, and the description is omitted.

An antenna 16 of this embodiment is disposed so that a circular waveguide antenna part 17 can be positioned coaxially with the center axis of the reactor 1 and at slightly inside of the inner circumferential face of the reactor 1. Around an opening provided on the outer circumferential face of the antenna 16, an introducing part 18 in the shape of a straight tube is connected so as to extend along a tangential line of the circular part 17.

The rectangular slits 15 are formed so as to extend along the diametral direction of the circular part 17, namely, so as to extend perpendicularly to the progressing direction of microwaves propagated through the circular part 17. Each of the slits 15 is positioned as follows: Among two intersections between the circle C and a normal line $L_2$ passing through a contact point $P_3$ where the circle C is in contact with an extension line L obtained by extending the center line of the introducing part 18, one other than the contact point $P_3$ is indicated as an intersection $P_2$. Two slits 15 are formed in positions away from the intersection $P_2$ in the both directions along the circle C by a distance of $(2n-1) \cdot \lambda g/4$ (wherein n is an integer and $\lambda g$ indicates the wavelength of the microwaves propagated through the antenna). The other plural slits 15 are formed in positions away from these two slits 15 in the both directions along the circle C by distances of $m \cdot \lambda g/2$ (wherein m is an integer).

Figure 12:
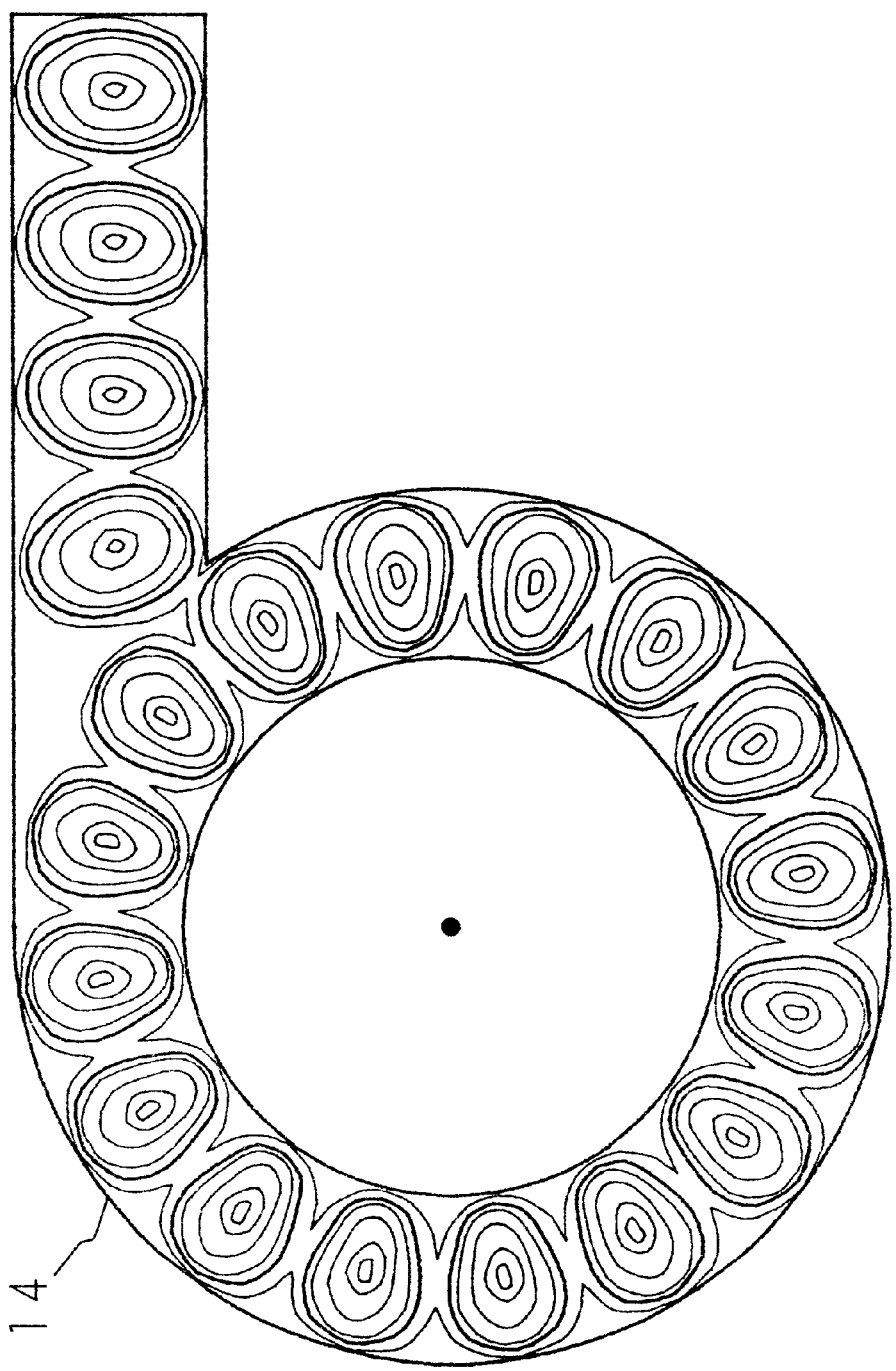
FIG. 12 is an explanatory diagram for illustrating the strength of a field distributed in a dielectric within an antenna of FIG. 10.

Each of these slits 15 is positioned at substantially the center of each of plural areas having a high electric field shown in FIG. 12. Similarly to the first embodiment, the high electric fields break through the slits 15 and are introduced into the reactor 1 through the sealing plate 4.

In each of the aforementioned first and second embodiments, each slit is hollow, which does not limit the invention, and a dielectric can be fit in each slit. When the microwave introduced into the antenna has high power, the electric field of the microwave can be locally collected at the corner of the slit, and there is a possibility of abnormal discharge caused between the slit and the sealing plate. This abnormal discharge can make the generated plasma unstable and ununiform, and the plasma process can be spoiled, or the slit or the sealing plate can be damaged. However, when a dielectric is fit in the slit, it is possible to prevent the electric field from collecting at the corner of the slit, and a space where the abnormal discharge can be caused can be covered with the dielectric. Accordingly, the abnormal discharge can be avoided. As a result, the sample can be processed with plasma stably and uniformly by using the microwave with higher power. As the dielectric fit in the slit, Teflon (registered trade name), quartz, alumina or the like that do not absorb a microwave can be used, among which alumina is preferred because it can prevent the electric field from locally collecting.

Embodiment 3

Figure 13:
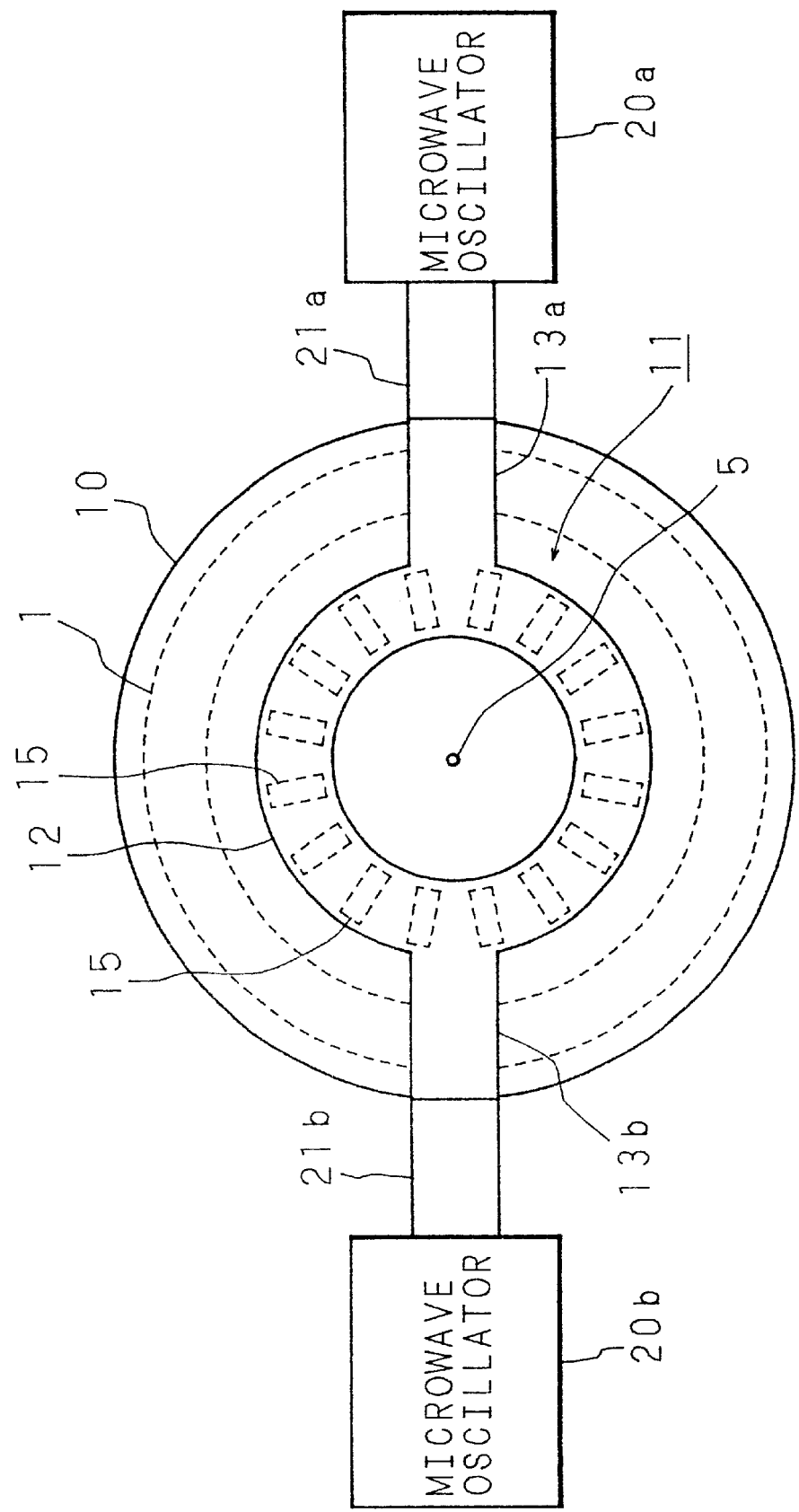
FIG. 13 is a plan view for showing the structure of a microwave plasma process apparatus according to a third embodiment of the invention.

FIG. 13 is a plan view of a microwave plasma process apparatus according to a third embodiment, wherein microwaves enter a circular waveguide antenna part from plural positions along the circumference. In FIG. 13, like reference numerals are used to refer to like elements shown in FIG. 4, and the description is omitted. As is shown in FIG. 13, openings disposed to oppose each other on the outer circumferential face of the circular waveguide antenna part 12 are respectively connected with introducing parts 13a and 13b for introducing microwaves into the circular part 12, so that the axial directions of the introducing parts 13a and 13b can extend along the diametral direction of the circular part 12. The introducing parts 13a and 13b and the circular part 12 are filled with a dielectric such as a fluororesin like Teflon (registered trademark), a polyethylene resin or a polystyrene resin (preferably, Teflon).

Microwave oscillators 20a and 20b are provided correspondingly to the introducing parts 13a and 13b, respectively, and waveguides 21a and 21b are connected between the microwave oscillators 20a and 20b and the introducing parts 13a and 13b, respectively. Microwaves oscillated by the microwave oscillators 20a and 20b enter the circular part 12 from the introducing parts 13a and 13b of the antenna 11 through the waveguides 21a and 21b. Since the introducing parts 13a and 13b are disposed to oppose each other on the circumference of the circular part 12 as described above, the microwaves having entered the circular part 12 from the introducing parts 13a and 13b generate plural areas having a high electric field distributed as is shown in FIG. 6 in the dielectric fit in the circular part 12.

In some cases, a microwave emitted into the reactor 1 from the vicinity of the introducing part 13a has higher energy than a microwave emitted from another part of the circular part 12. However, since a microwave enters also from the other introducing part 13b, the decrease in the energy can be avoided. Since the introducing parts 13a and 13b are thus disposed to oppose each other on the circumference of the circular part 12, the energy decrease in the microwaves can be mutually compensated, and the microwaves can be more uniformly introduced into the reactor 1.

In this embodiment, the two introducing parts 13a and 13b are disposed to oppose each other on the outer circumferential face of the circular part 12, which does not limit the invention. Alternatively, plural introducing parts can be disposed on the outer circumferential face of the circular part 12 so as to be axially symmetrical about the center axis of the circular part 12.

Now, description will be given on a microwave plasma process apparatus in which plasma can be sufficiently diffused even when a distance between the antenna and the sample is small.

Embodiment 4

Figure 14:
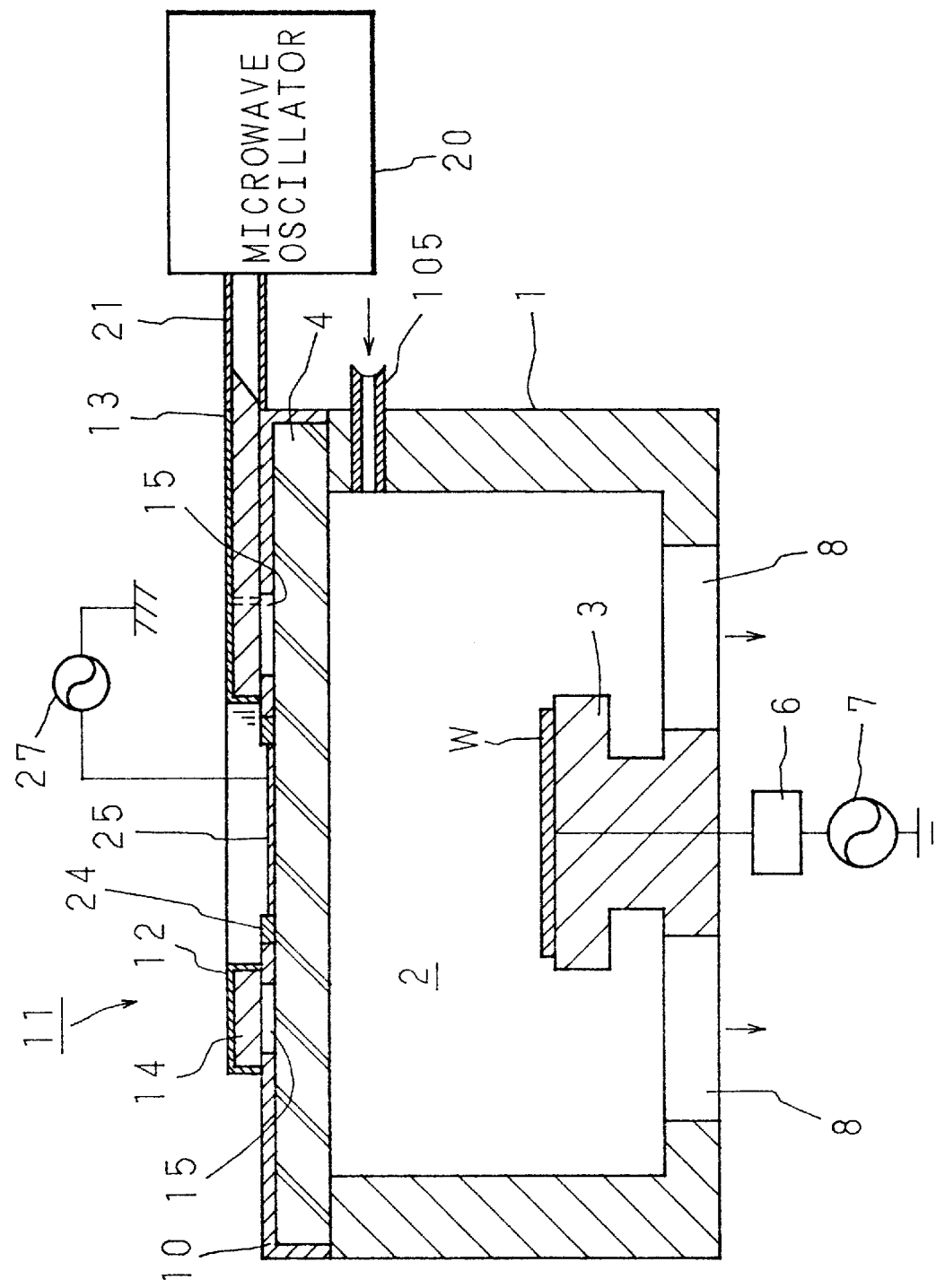
FIG. 14 is a side sectional view for showing the structure of a microwave plasma process apparatus according to a fourth embodiment of the invention.
Figure 15:
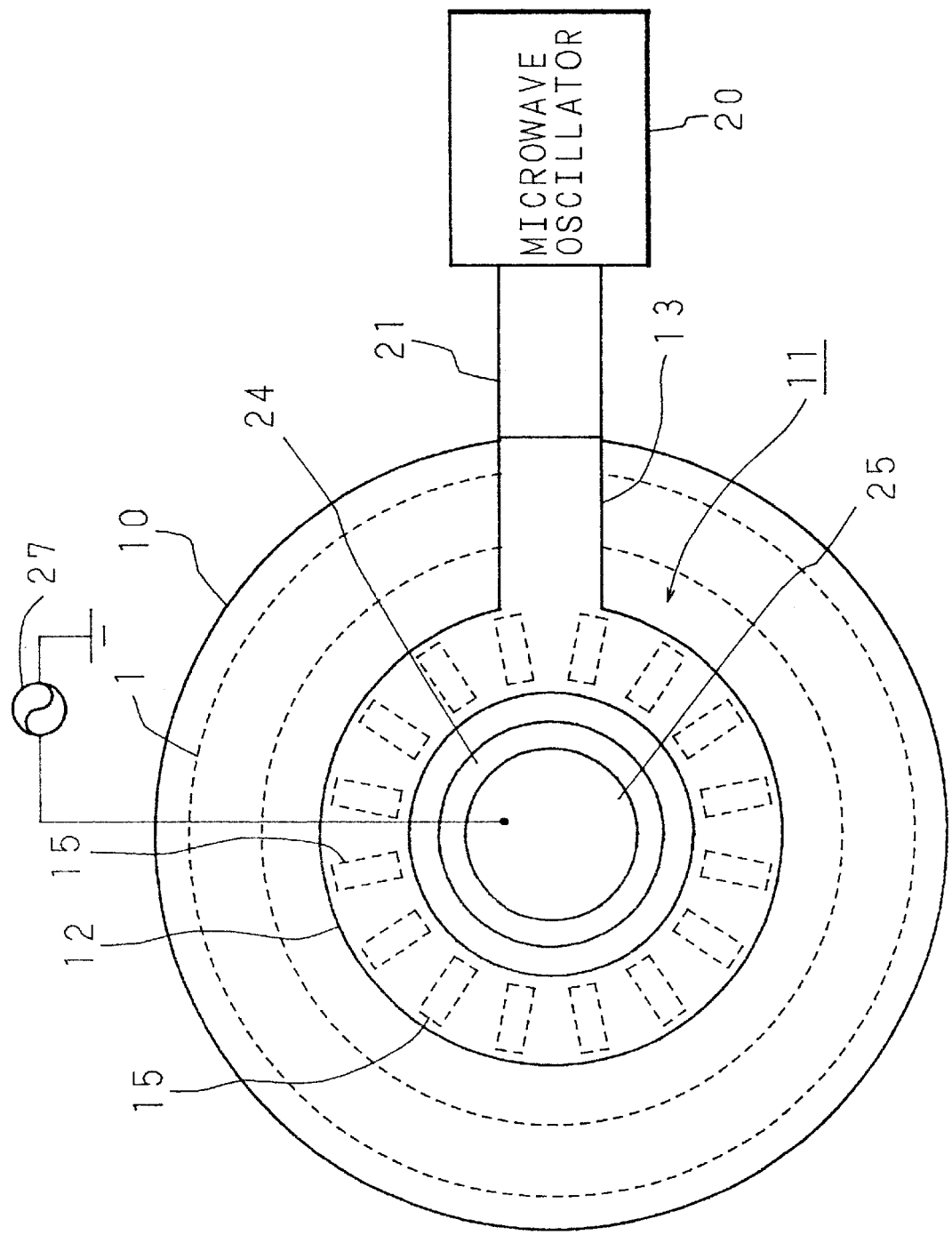
FIG. 15 is a plan view of the microwave plasma process apparatus of FIG. 14.

FIG. 14 is a side sectional view for showing the structure of a microwave plasma process apparatus according to a fourth embodiment, and FIG. 15 is a plan view of the microwave plasma process apparatus of FIG. 14. A reactor 1 in the shape of a bottomed cylinder is made from aluminum. A gas inlet tube 105 is connected at the side wall of the reactor 1, so that gasses can be introduced into a process chamber 2.

The upper face and the outer circumferential face of a sealing plate 4 are covered with a cover 10 formed out of a conductive metal in the shape of a circular cap and provided with a circular hole at the center thereof, and the cover 10 is fixed on the reactor 1. Around the hole, an antenna 11 for introducing microwaves into the reactor 1 is set. The antenna 11 is fixed on the upper face of the cover 10 similarly to that of the first embodiment, and includes a circular waveguide antenna part 12. Plural slits 15 are formed in portions of the cover 10 opposing the circular part 12.

In the hole formed at the center of the cover 10, a ring-shaped insulating member 24 is fit, and a disk-shaped electrode 25 is fit in the insulating member 24. When the antenna 11 having the same dimension as described in the first embodiment is used, the diameter of the electrode 25 is approximately 100 mm. The electrode 25 is connected with a second high frequency power supply 27 through a coaxial cable, so that the second high frequency power supply 27 can apply a high frequency power of frequencies of 13.56 MHz to the electrode 25. The rest of the structure and the dimension are the same as those described in the first embodiment, and hence, like reference numerals are used to refer to like elements and the description is omitted.

In etching the surface of a sample W by using this microwave plasma process apparatus, after decreasing the pressure within the process chamber 2 to a desired pressure by exhausting through the air outlet 8, a reaction gas is supplied into the chamber 2 through the gas inlet tube 105. Then, microwaves of 2.45 GHz are introduced to the antenna 11. Then, an electric field emitted from each of the slits 15 of the antenna 11 into the chamber 2. Thus, plasma is generated in the chamber 2. As a result, the same effects as those of the first embodiment can be attained.

The high frequency of power of frequencies 13.56 MHz is applied to the electrode 25 by the second high frequency power supply 27, thereby generating plasma in an area corresponding to the electrode 25 in the vicinity of the plate 4 within the chamber 2. The plasma generated in these areas is diffused from the respective areas and propagated to the table 3, so that the substantially uniformly diffused plasma etches the surface of the sample W placed on the table 3. In this manner, since the plasma is generated also in the area corresponding to the center of the antenna 11, even when the distance between the table 3 and the plate 4 is small, namely, even when a diffusion distance is small, it is possible to obtain substantially uniform plasma on the same plane as the surface of the table 3. As a result, the entire dimension of the microwave plasma process apparatus can be further decreased and the etch rate can be enhanced.

Furthermore, the plasma can be generated within the chamber 2 by applying the high frequency field to the electrode 25 in addition to the plasma generated by using the microwaves field emitted from the antenna 11. Therefore, the etch rate at the center and at the edge of the sample can be made uniform by controlling the power of the high frequency field applied to the electrode 25 without adjusting the power of the microwaves.

In the fourth embodiment, the slits are formed so as to extend perpendicularly to the progressing direction of the microwaves propagated through the circular part 12, which does not limit the invention. As described above, the slits can be formed so as to diagonally cross the progressing direction of the microwaves, or to extend along the progressing direction of the microwaves. When the slits are formed so as to extend diagonally cross the progressing direction of the microwaves or extend along the progressing direction of the microwaves, the change of positions corresponding to the maximum value of the current can be covered. This also applies to any of the following embodiments.

Embodiment 5

Figure 16:
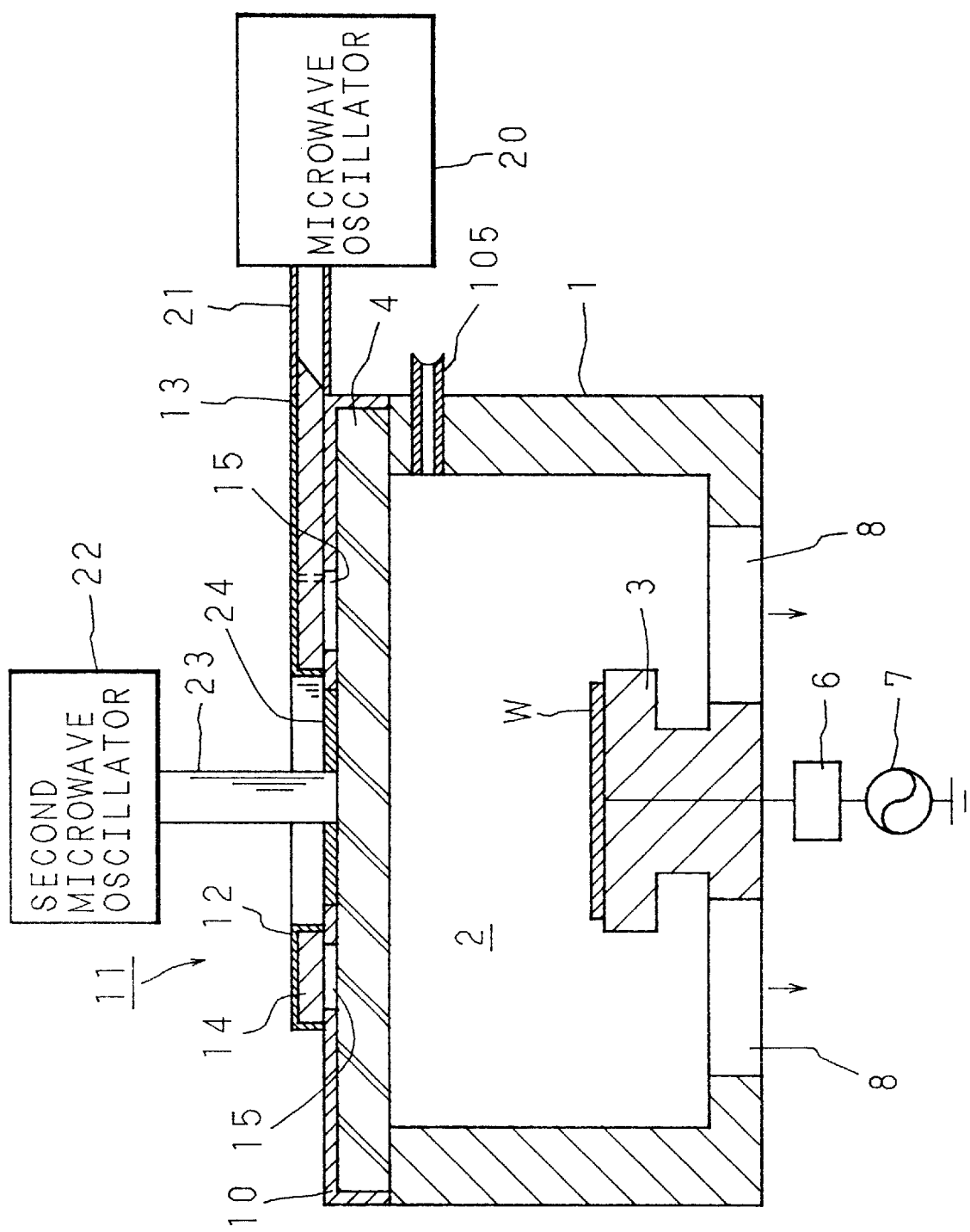
FIG. 16 is a side sectional view for showing the structure of a microwave plasma process apparatus according to a fifth embodiment of the invention.

FIG. 16 is a side sectional view of a microwave plasma process apparatus according to a fifth embodiment, wherein the second high frequency power supply 27 is replaced with a second microwave oscillator 22. In FIG. 16, like reference numerals are used to refer to like elements shown in FIG. 14, and the description is omitted. As is shown in FIG. 16, the ring-shaped insulating member 24 is fit in the circular hole formed at the center of the cover 10, and one end of a second waveguide 23 in a cylindrical shape is fit in the insulating member 24. The other end of the second waveguide 23 is connected with the second microwave oscillator 22 for oscillating a microwave of 2.45 GHz.

In this microwave plasma process apparatus, microwaves are oscillated by the microwave oscillator 20, the microwaves are introduced into the antenna 11, and an electric field is emitted into the process chamber 2 from each of the slits 15 in the same manner as in the aforementioned embodiment. Thus, plasma is generated in areas respectively corresponding to the slits 15 in the vicinity of the sealing plate 4 within the chamber 2. Also, a microwave of 2.45 GHz is oscillated by the second microwave oscillator 22, and the microwave is introduced to the center of the plate 4 by the second waveguide 23 and further introduced into the chamber 2 from the center of the plate 4. Thus, plasma is generated in an area corresponding to the opening of the second waveguide 23 in the vicinity of the plate 4 within the chamber 2. In this manner, even when the distance between the table 3 and the plate 4 is small, it is possible to obtain substantially uniform plasma on the same plane as the surface of the table 3. As a result, the entire dimension of the microwave plasma process apparatus can be decreased and the etch rate can be increased as described above.

Furthermore, the plasma can be generated within the chamber 2 by using the microwave energy oscillated by the second microwave oscillator 22 in addition to the plasma generated by using the microwaves energy oscillated by the microwave oscillator 20. Therefore, the etch rate at the center and at the edge of the sample can be made uniform by controlling the power of the microwaves oscillated by the second microwave oscillator 22 without adjusting the power of the microwave oscillated by the microwave oscillator 20.

Embodiment 6

Figure 17:
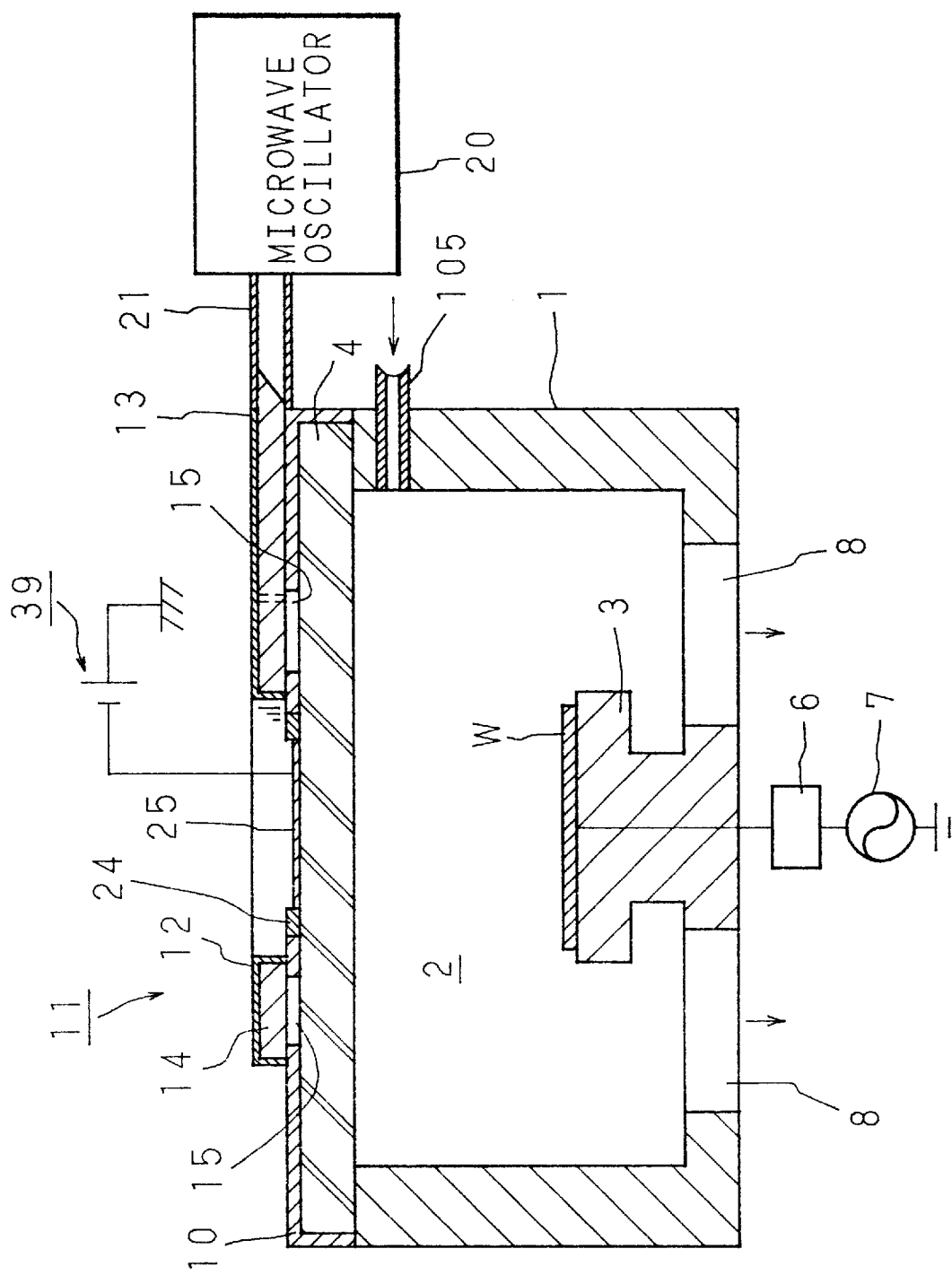
FIG. 17 is a side sectional view for showing the structure of a microwave plasma process apparatus according to a sixth embodiment of the invention.

FIG. 17 is a side sectional view of a microwave plasma process apparatus according to a sixth embodiment, wherein the high frequency power supply 27 of FIG. 14 is replaced with a DC power supply 39 for applying a DC voltage to the electrode 25. In FIG. 17, like reference numerals are used to refer to like elements shown in FIG. 14, and the description is omitted. As is shown in FIG. 17, the electrode 25 is connected with the negative terminal of the DC power supply 39, so that a predetermined negative voltage can be applied to the electrode 25 by the DC power supply 39.

In this microwave plasma process apparatus, microwaves of 2.45 GHz are oscillated, the microwaves are introduced into the antenna 11, and an electric field is emitted into the process chamber 2 from each of the slits 15 in the same manner as in the aforementioned embodiment. Thus, plasma is generated in areas respectively corresponding to the slits 15 in the vicinity of the sealing plate 4 within the chamber 2. Also, the negative voltage is applied to the electrode 25 by the DC power supply 39 for a predetermined time period, thereby moving positive ions included in the plasma toward the center of the chamber 2. As a result, even when the distance between the table 3 and the plate 4 is small, it is possible to obtain substantially uniform plasma on the same plane as the surface of the table 3. Thus, the entire dimension of the microwave plasma process apparatus can be decreased and the etch rate can be improved as described above.

Embodiment 7

Figure 18:
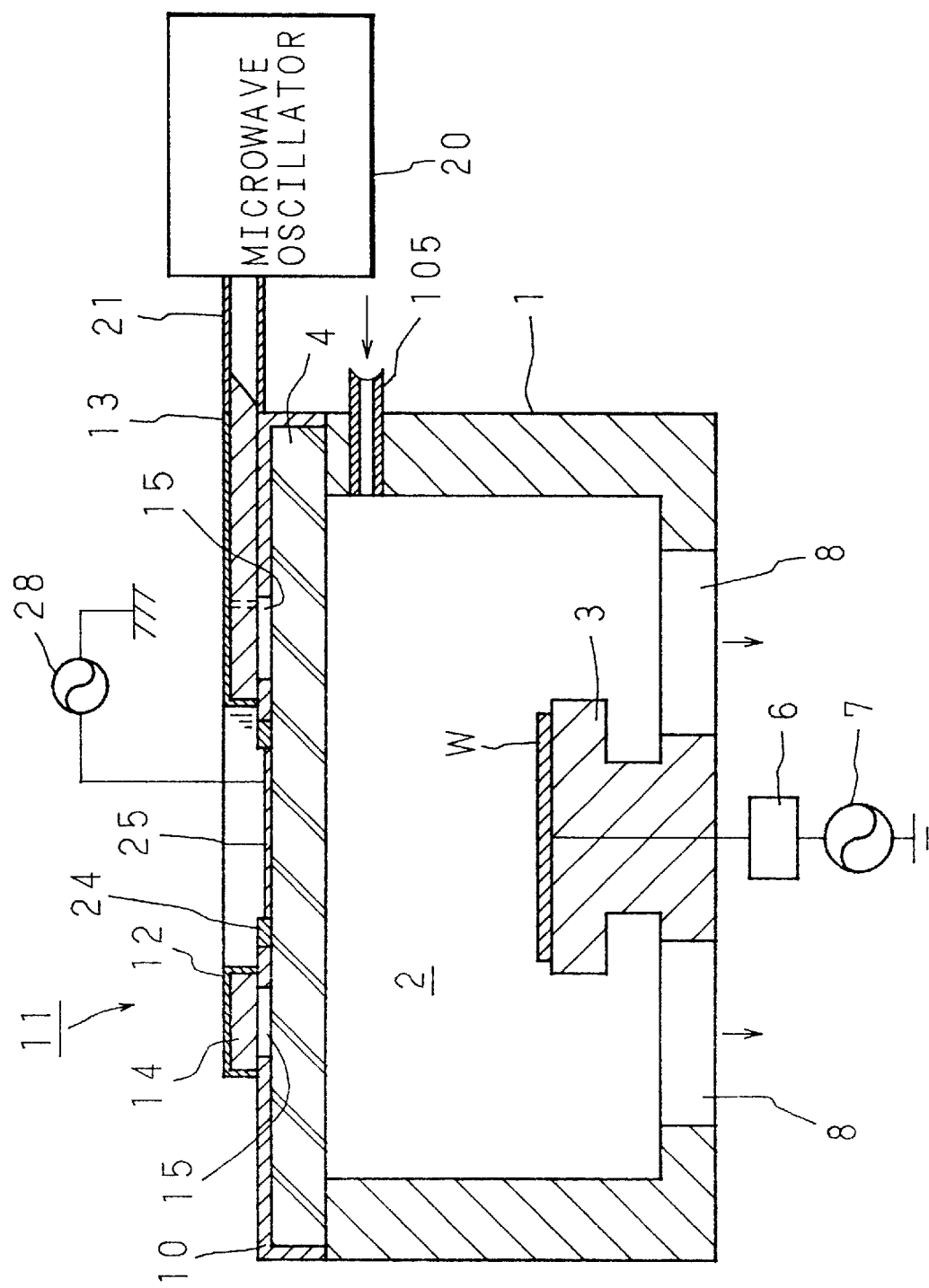
FIG. 18 is a side sectional view for showing the structure of a microwave plasma process apparatus according to a seventh embodiment of the invention.

FIG. 18 is a side sectional view of a microwave plasma process apparatus according to a seventh embodiment, wherein the second high frequency power supply 27 of FIG. 14 is replaced with a low frequency power supply 28 for applying a low frequency power of frequencies of 400 KHz to the electrode 25. In FIG. 18, like reference numerals are used to refer to like elements shown in FIG. 14, and the description is omitted. As is shown in FIG. 18, the electrode 25 is connected with the output terminal of the low frequency power supply 28, so that the low frequency power supply 37 can apply the low frequency power to the electrode 25.

In this microwave plasma process apparatus, microwaves of 2.45 GHz are oscillated, the microwaves are introduced into the antenna 11, and an electric field is emitted into the process chamber 2 from each of the slits 15 in the same manner as in the aforementioned embodiment. Thus, plasma is generated in areas respectively corresponding to the slits 15 in the vicinity of the sealing plate 4 within the chamber 2. Also, the low frequency power is applied to the electrode 25 by the low frequency power supply 28.

In applying an electric field of such a low frequency, positive ions included in the plasma are moved toward the center of the chamber 2 when the electric field is negative and moved in the reverse direction when the field is positive. Accordingly, the diffusion efficiency of the plasma can be improved while stably retaining the state of the generated plasma. As a result, even when the distance between the table 3 and the plate 4 is small, it is possible to obtain substantially uniform plasma on the same plane as the surface of the table 3 similarly to the aforementioned embodiments. Thus, the entire dimension of the microwave plasma process apparatus can be decreased and the etch rate can be increased as described above.

In this embodiment, the low frequency power supply 28 applies 400 KHz power to the electrode 25, but the frequency is not limited to 400 KHz but can be 200 KHz through 2 MHz.

Embodiment 8

Figure 19:
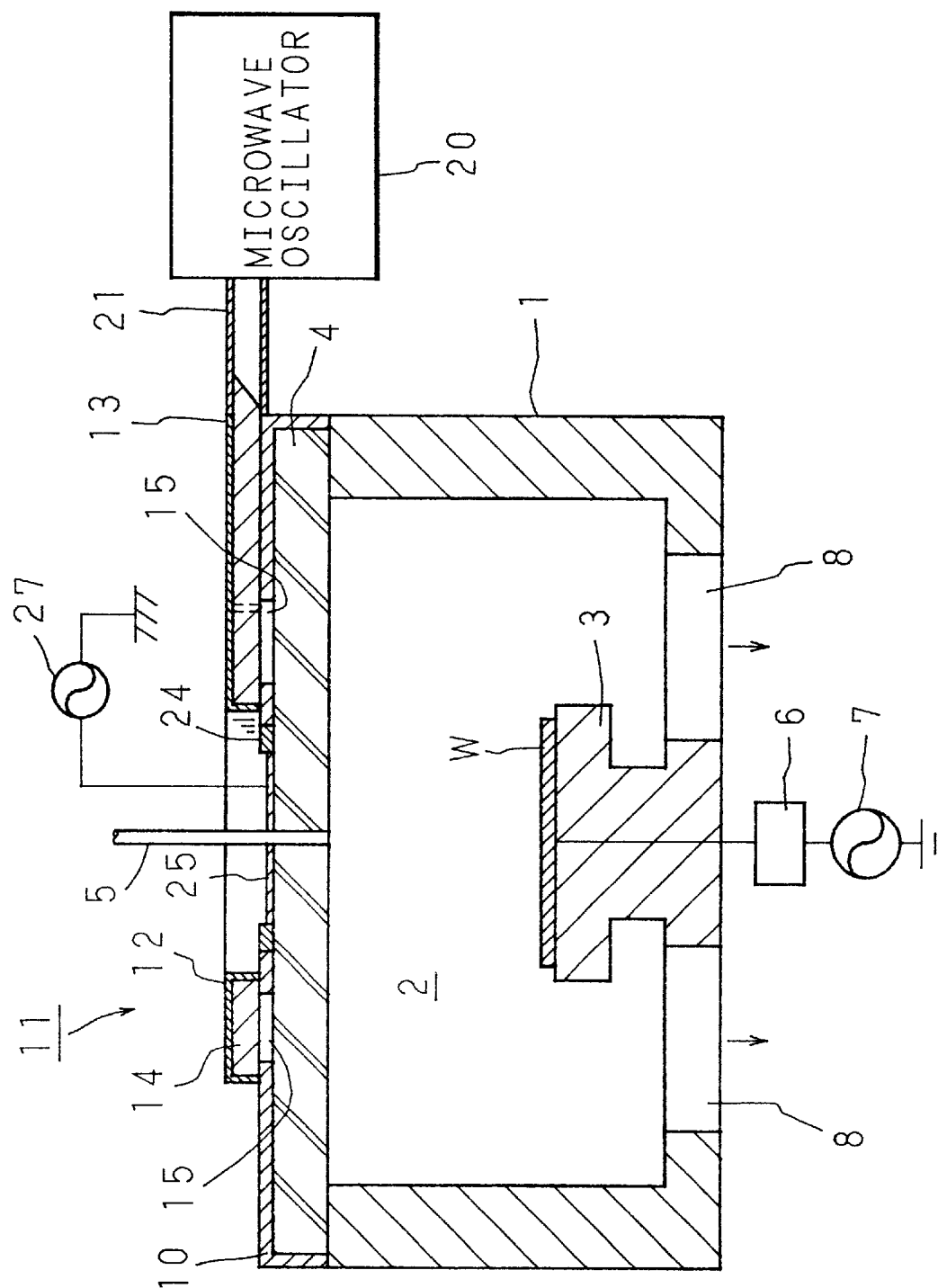
FIG. 19 is a side sectional view for showing the structure of a microwave plasma process apparatus according to an eighth embodiment of the invention.

FIG. 19 is a side sectional view for showing the structure of a microwave plasma process apparatus according to an eighth embodiment, wherein a gas is introduced into the process chamber 2 from the center of the sealing plate 4. In FIG. 19, like reference numerals are used to refer to like elements shown in FIG. 14, and the description is omitted. As is shown in FIG. 19, the electrode 25 is provided, at its center, with a through hole penetrating the electrode 25 and the plate 4, and the gas inlet tube 5 is fit in the through hole.

In this microwave plasma process apparatus, since a reaction gas is supplied into the chamber 2 through the gas inlet tube 5 disposed at the center of the electrode 25, the reaction gas is radially diffused toward the entire periphery from substantially the center of the chamber 2. Accordingly, the plasma is generated in a more uniform density in the entire process chamber 2, resulting in etching the sample W at a more uniform speed. Moreover, most of the reaction gas is supplied to the plasma generated in the chamber 2, and the supplied reaction gas remains in the plasma for a comparatively long period of time. Accordingly, the usage efficiency of the reaction gas can be improved. On the other hand, since the gas inlet tube 5 is disposed in the electrode 25 surrounded with the circular waveguide antenna part 12, the gas inlet tube 5 does not harmfully affect the microwave propagated through the circular part 12.

Figure 20:
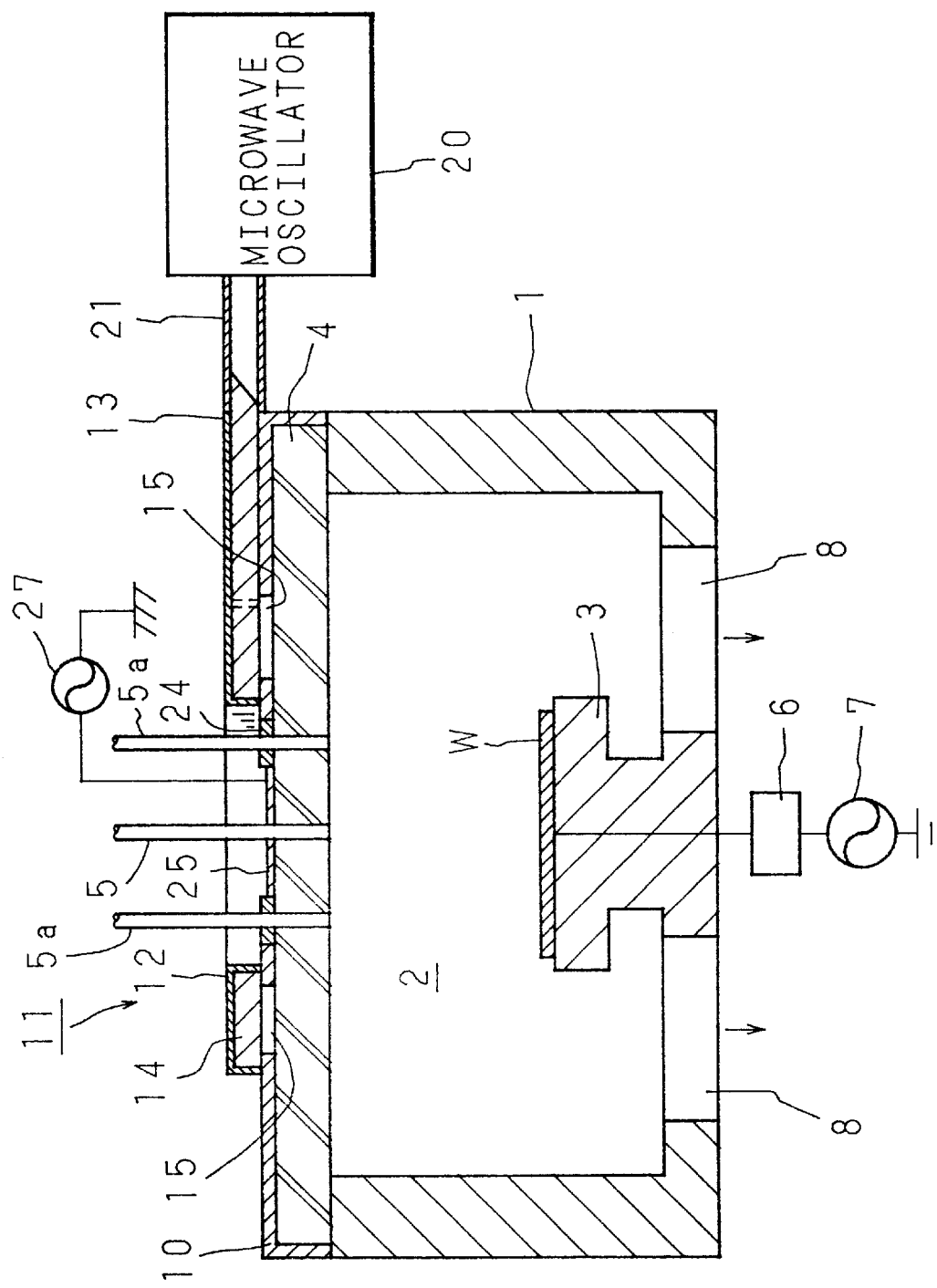
FIG. 20 is a side sectional view for showing another structure of the microwave plasma process apparatus of the eighth embodiment.

In this embodiment, the gas inlet tube 5 is disposed on the electrode 25, which does not limit the invention. A gas inlet tube 5a can be fit in one or more through holes formed in the insulating member 24 so as to penetrate the insulating member 24 and the sealing plate 4 as is shown in FIG. 20. Alternatively, the gas inlet tube can be provided on both the electrode 25 and the insulating member 24. When the insulating member 24 is provided with plural gas inlet tubes, the gas inlet tubes are symmetrically disposed around the center axis of the insulating member 24. In this manner, a reaction gas can be more uniformly introduced into the entire chamber 2.

In this embodiment, the ring-shaped insulating member 24 is used, which does not limit the invention. Alternatively, a predetermined distance can be provided between the circular part 12 and the electrode 25.

Embodiment 9

Figure 21:
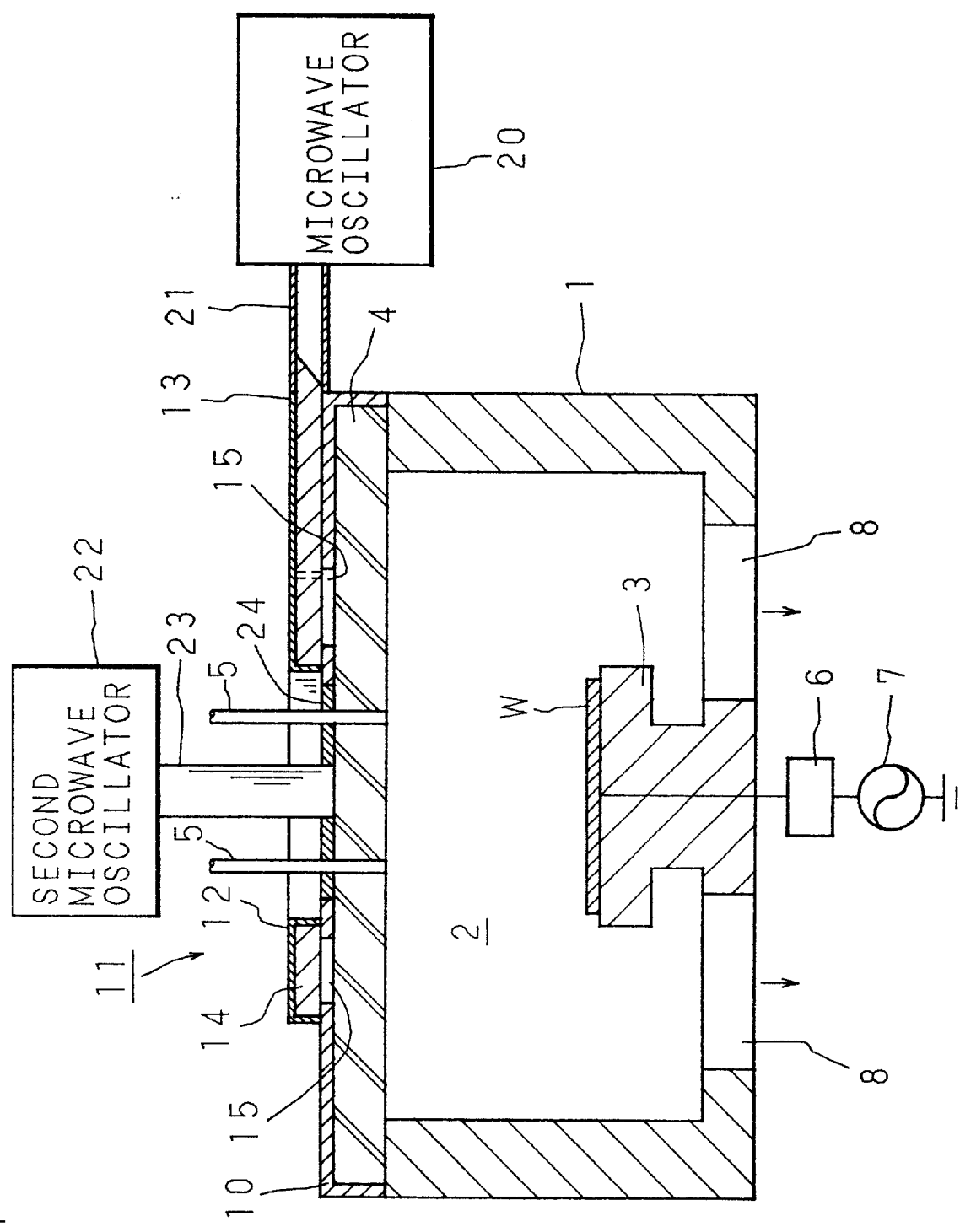
FIG. 21 is a side sectional view for showing the structure of a microwave plasma process apparatus according to a ninth embodiment of the invention.

FIG. 21 is a side sectional view of a microwave plasma process apparatus according to a ninth embodiment, wherein the second high frequency power supply 27 is replaced with a second microwave oscillator 22 and a gas is introduced into a process chamber 2 from the center of a sealing plate 4. In FIG. 21, like reference numerals are used to refer to like elements shown in FIG. 16, and the description is omitted. As is shown in FIG. 21, the ring-shaped insulating member 24 is provided with plural through holes formed at a predetermined pitch and penetrating the insulating member 24 and the plate 4, and gas inlet tubes 5 are fit in the respective through holes.

In this microwave plasma process apparatus, the reaction gas is introduced into the chamber 2 through the gas inlet tubes 5 provided on the insulating member 24. Therefore, the reaction gas is radially diffused. As a result, plasma can be generated in a substantially uniform density in the entire chamber 2, and the usage efficiency of the reaction gas can be improved.

In this embodiment, the plural gas inlet tubes 5 are provided on the insulating member 24, which does not limit the invention. The insulating member 24 can be provided with only one gas inlet tube 5. Furthermore, when the plural gas inlet tubes 5 are provided on the insulating member 24, the gas inlet tubes 5 are disposed symmetrically around the center axis of the insulating member 24. Thus, the reaction gas can be more uniformly introduced into the entire chamber 2.

In each of the aforementioned fourth through ninth embodiments, the introducing part 13 is connected with the circular waveguide antenna part 12 so as to extend along the diametral direction of the circular part 12, which does not limit the invention. Alternatively, as is described in the second embodiment (shown in FIG. 11), the introducing part 18 can be connected with the circular part 12 so as to extend along a tangential line of the circular part 12. Also, in each of the embodiments, the introducing part 13 is disposed on the outer circumferential face of the circular part 12, which does not limit the invention. Alternatively, as is described in the third embodiment (shown in FIG. 13), plural introducing parts can be provided on the outer circumferential face of the circular part 12 so as to be disposed axially symmetrically about the center axis of the circular part 12. Thus, the energy of the microwaves emitted from the circular part 12 to the reactor 1 can be made more uniform along the circumferential direction of the circular part 12.

In each of the third through ninth embodiments, each of the slits is hollow, which does not limit the invention. A dielectric can be fit in each slit. Thus, the collection of the electric field at the corner of the slit can be avoided as described above, and the space where the abnormal discharge can be caused can be covered with the dielectric. Thus, a sample can be treated with plasma stably and uniformly by using a microwave with higher power.

In each of the first through ninth embodiments, the dielectric 14 is fit in the circular part 12, which does not limit the invention. The circular part 12 can be hollow without being filled with the dielectric 14. However, when the dielectric 14 is fit in the circular part 12, the wavelength of a microwave having entered the circular part 12 can be decreased by $1/\sqrt{\varepsilon r}$ (wherein $\varepsilon r$ indicates a dielectric constant of the dielectric). Accordingly, in using the circular part 12 having the same diameter, the number of positions corresponding to the maximum current value of the current flowing in the wall of the circular part 12 is larger when the dielectric is fit than when the dielectric is not fit. Therefore, the number of the slits 15 can be increased. Accordingly, the microwave energy can be more uniformly introduced into the chamber 2.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A microwave plasma process apparatus, comprising:
   a chamber being sealed with a sealing member;
   a gas inlet tube for introducing a gas into the chamber; and
   an antenna opposing a surface of the sealing member, wherein the antenna including:
      a tubular member in a circular shape for propagating the microwaves;
      an entrance disposed on a circumferential face of the tubular member for introducing the microwaves into the tubular member; and
      a slit formed in an axial face of the tubular member opposing the sealing member.

2. The microwave plasma process apparatus according to claim 1, wherein the slit is plural in number and the plural slits are formed at predetermined intervals from a position where the microwaves simultaneously progressing through the tubular member in reverse directions from the entrance come into collision with each other.

3. The microwave plasma process apparatus according to claim 1, wherein the slit is plural in number and a distance L between adjacent slits is determined in accordance with the following expression:

$$L = m \cdot \lambda g/2$$

wherein m indicates an integer and $\lambda g$ indicates a wavelength of the microwaves propagated through the antenna.

4. The microwave plasma process apparatus according to claim 2, wherein a slit is formed in a position away from the position where the microwaves come into collision with each other by a distance of $(2n-1)\cdot\lambda g/4$ and another slit is formed in a position away from the slit by a distance of $m\cdot\lambda g/2$, wherein m and n indicate integers and $\lambda g$ indicates a wavelength of the microwaves propagated through the antenna.

5. The microwave plasma process apparatus according to claim 1, wherein a center line of the tubular member which passes through center points of sections of the tubular member taken on a plane including a center axis of the circular shape of the tubular member has a length given by a substantially integral multiple of a wavelength of the microwaves propagated through the antenna.

6. The microwave plasma process apparatus according to claim 1, wherein a dielectric is fit in the tubular member.

7. The microwave plasma process apparatus according to claim 1, wherein the slit is formed so as to extend in a direction crossing a center axis of the tubular member.

8. The microwave plasma process apparatus according to claim 1, wherein the slit is formed so as to extend in a direction substantially parallel to a center axis of the tubular member.

9. The microwave plasma process apparatus according to claim 1, further comprising a microwave introducing part connected with the entrance disposed on the tubular member so as to extend along a diametral direction of the tubular member.

10. The microwave plasma process apparatus according to claim 1, further comprising a microwave introducing part connected with the entrance disposed on the tubular member so as to extend along a tangential line of the tubular member.

11. The microwave plasma process apparatus according to claim 1, wherein the entrance is plural in number and provided on a circumferential face of the tubular member for allowing the microwaves to enter the tubular member through the plural entrances.

12. The microwave plasma process apparatus according to claim 1, wherein a dielectric is fit in the slit.

13. The microwave plasma process apparatus according to claim 1, wherein a through hole penetrating the sealing member is formed in an area of the sealing member surrounded with the antenna, and a tube for introducing the gas is fit in the through hole.

14. The microwave plasma process apparatus according to claim 1, further comprising an electrode disposed in an area on the sealing member surrounded with the antenna and electrically insulated from the antenna.

15. The microwave plasma process apparatus according to claim 14, further comprising a power supply for applying an AC field of a high frequency to the electrode.

16. The microwave plasma process apparatus according to claim 14, further comprising a power supply for applying an AC field of a low frequency to the electrode.

17. The microwave plasma process apparatus according to claim 14, further comprising a power supply for applying a DC field to the electrode.

18. The microwave plasma process apparatus according to claim 14, further comprising a gas inlet tube, for introducing the gas into the chamber, penetrating the electrode and the sealing member.

19. The microwave plasma process apparatus according to claim 14, further comprising a gas inlet tube, for introducing the gas into the chamber, penetrating a space between the electrode and a portion of the sealing member surrounded with the antenna.

20. The microwave plasma process apparatus according to claim 1, further comprising:
    a waveguide connected with an area on the sealing member surrounded with the antenna; and
    a microwave oscillator for oscillating a microwave into the waveguide.

21. The microwave plasma process apparatus according to claim 20, further comprising a gas inlet tube, for introducing the gas into the chamber, penetrating a space between the waveguide and the area on the sealing member surrounded with the antenna.

22. A microwave plasma process method of processing a target with plasma generated by using an introduced microwave, comprising the steps of:
    introducing the microwave into an antenna of a plasma process apparatus; and
    introducing a gas into a chamber through a gas inlet tube of the plasma process apparatus,
    wherein the plasma process apparatus comprises:
        the chamber being sealed with a sealing member;
        the gas inlet tube for introducing the gas into the chamber;
        the antenna opposing a surface of the sealing member, the antenna including:
            a tubular member in a circular shape for propagating the microwave;
            an entrance disposed on a circumferential face of the tubular member for introducing the microwave into the tubular member; and
            a slit formed in an axial face of the tubular member opposing the sealing member.

23. The microwave plasma process method according to claim 22,
    wherein the plasma process apparatus further includes:
        a through hole penetrating the sealing member being formed in a portion surrounded with the antenna; and
        a tube for introducing the gas fit in the through hole.

24. The microwave plasma process method according to claim 22, further comprising the step of applying a voltage to an electrode,
    wherein the plasma process apparatus further includes the electrode disposed in an area on the sealing member surrounded with the antenna and electrically insulated from the antenna.

25. The microwave plasma process method according to claim 22, further comprising the step of oscillating a microwave into a waveguide,
    wherein the plasma process apparatus further includes:
        the waveguide connected with an area on the sealing member surrounded with the antenna; and
        a microwave oscillator for oscillating the microwave into the waveguide.

* * * * *